United States Patent
Johnson et al.

(10) Patent No.: US 6,815,959 B2
(45) Date of Patent: Nov. 9, 2004

(54) SYSTEMS AND METHODS FOR MEASURING PROPERTIES OF CONDUCTIVE LAYERS

(75) Inventors: Walter H. Johnson, San Jose, CA (US); Torsten Borchers, Pleasonton, CA (US); Daniel Griffing, Sunnyvale, CA (US); Andrei Danet, Concord, CA (US); George Erskine, San Jose, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 10/119,377

(22) Filed: Apr. 9, 2002

(65) Prior Publication Data

US 2003/0060092 A1 Mar. 27, 2003

Related U.S. Application Data

(60) Provisional application No. 60/282,676, filed on Apr. 9, 2001.

(51) Int. Cl.[7] .......................... G01R 27/08; G01R 31/02
(52) U.S. Cl. ........................ 324/718; 324/754; 324/758
(58) Field of Search ................................ 324/754, 761, 324/158.1, 72.5, 691, 693, 696, 699, 715, 718, 724, 758; 438/490

(56) References Cited

U.S. PATENT DOCUMENTS

| | | | | |
|---|---|---|---|---|
| 3,783,375 A | * | 1/1974 | Bennett | 324/601 |
| 3,992,073 A | * | 11/1976 | Buchoff et al. | 439/86 |
| 4,423,373 A | * | 12/1983 | LeCroy, Jr. | 324/72.5 |
| 4,590,422 A | * | 5/1986 | Milligan | 324/754 |
| 4,989,154 A | * | 1/1991 | Yamashita et al. | 702/65 |
| 5,214,389 A | | 5/1993 | Cao et al. | 324/719 |
| 5,225,771 A | * | 7/1993 | Leedy | 324/757 |
| 5,578,504 A | | 11/1996 | Mitani et al. | 438/17 |
| 5,744,971 A | * | 4/1998 | Chan et al. | 324/643 |
| 6,023,171 A | | 2/2000 | Boyette, Jr. et al. | 324/754 |
| 6,323,667 B1 | | 11/2001 | Kazama | 324/761 |
| 6,356,089 B2 | * | 3/2002 | Bayer et al. | 324/754 |
| 6,366,103 B1 | * | 4/2002 | Cheng | 324/754 |
| 6,404,213 B2 | * | 6/2002 | Noda | 324/754 |

FOREIGN PATENT DOCUMENTS

| | | | | |
|---|---|---|---|---|
| WO | WO 81/03396 | * | 11/1981 | 324/754 |

OTHER PUBLICATIONS

Search Report, application No. PCT/US 02/28954, mailed Dec. 31, 2002.

Nadeau et al., "Effect of Tungsten Probes on Wafer–Probe Yield in a Production Environment," Microelectronic Manufacturing and Testing, Sep. 1989, pp. 35–37.

* cited by examiner

*Primary Examiner*—Anjan K. Deb
(74) *Attorney, Agent, or Firm*—Ann Marie Mewherler; Conley Rose P.C.

(57) ABSTRACT

A pin configured to be disposed within a probe is provided. The probe may be configured to measure a property of a conductive layer. The pin may include a contact surface which may be substantially planar. The pin may also include a first portion extending from the contact surface. A cross-sectional area of the first portion, in a direction substantially parallel to the contact surface, may be substantially equal to a surface area of the contact surface across a length of the first portion. A system configured to measure a property of a conductive layer is also provided. The system may include a mounting device and at least two probes coupled to the mounting device. The probes may be configured to measure the property of a conductive layer. In addition, the mounting device may be configured such that one of the probes may contact the conductive layer during measurement.

22 Claims, 14 Drawing Sheets

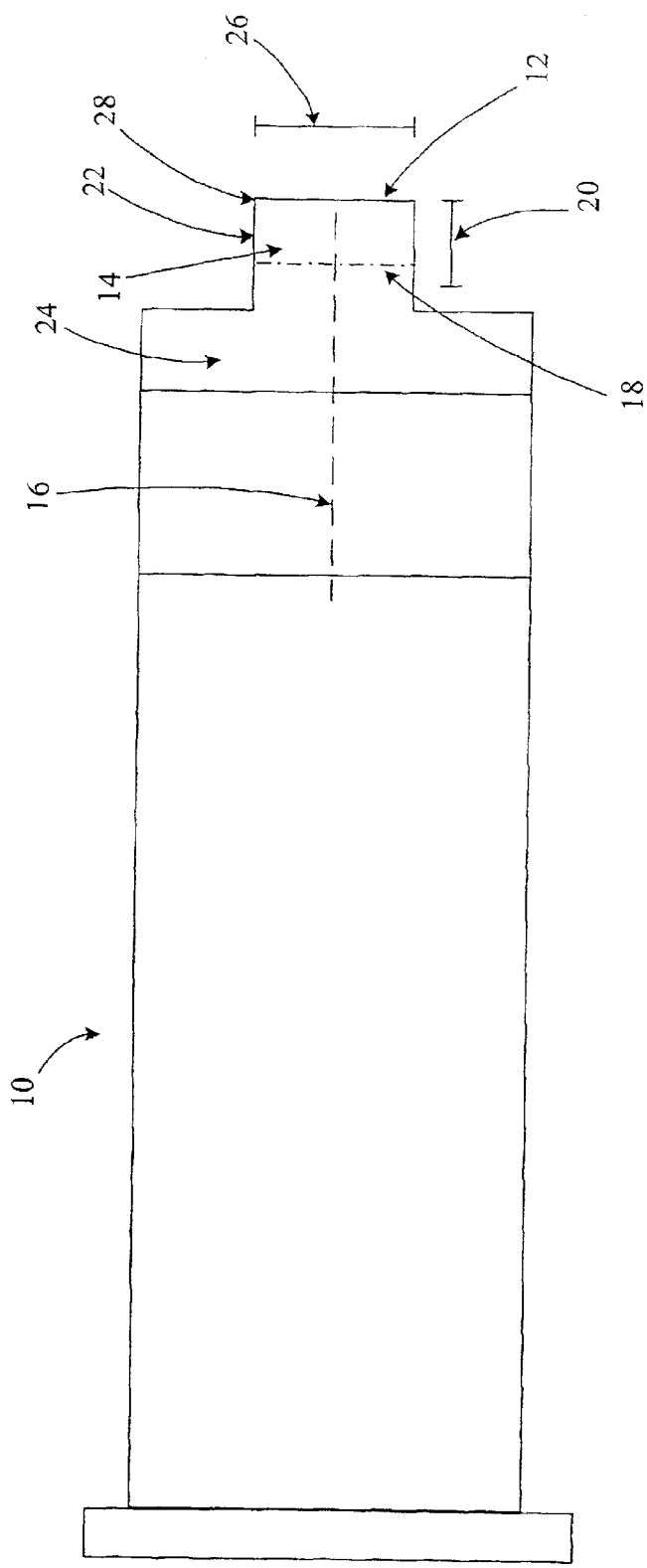
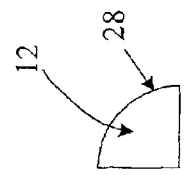
Fig. 1B
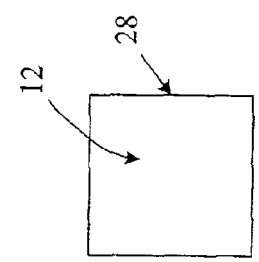
Fig. 2C
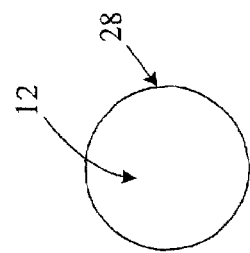
Fig. 2B
Fig. 2A

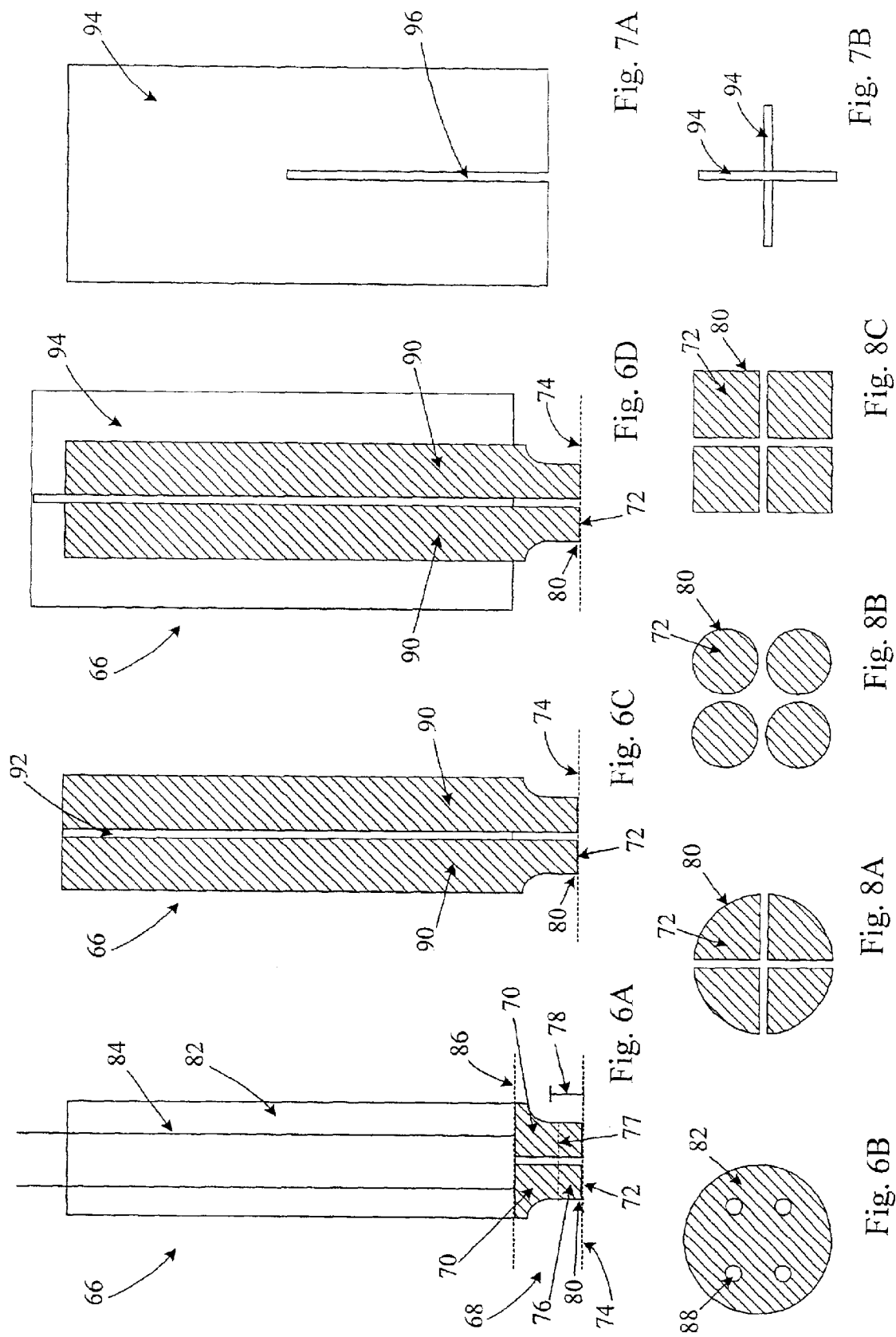

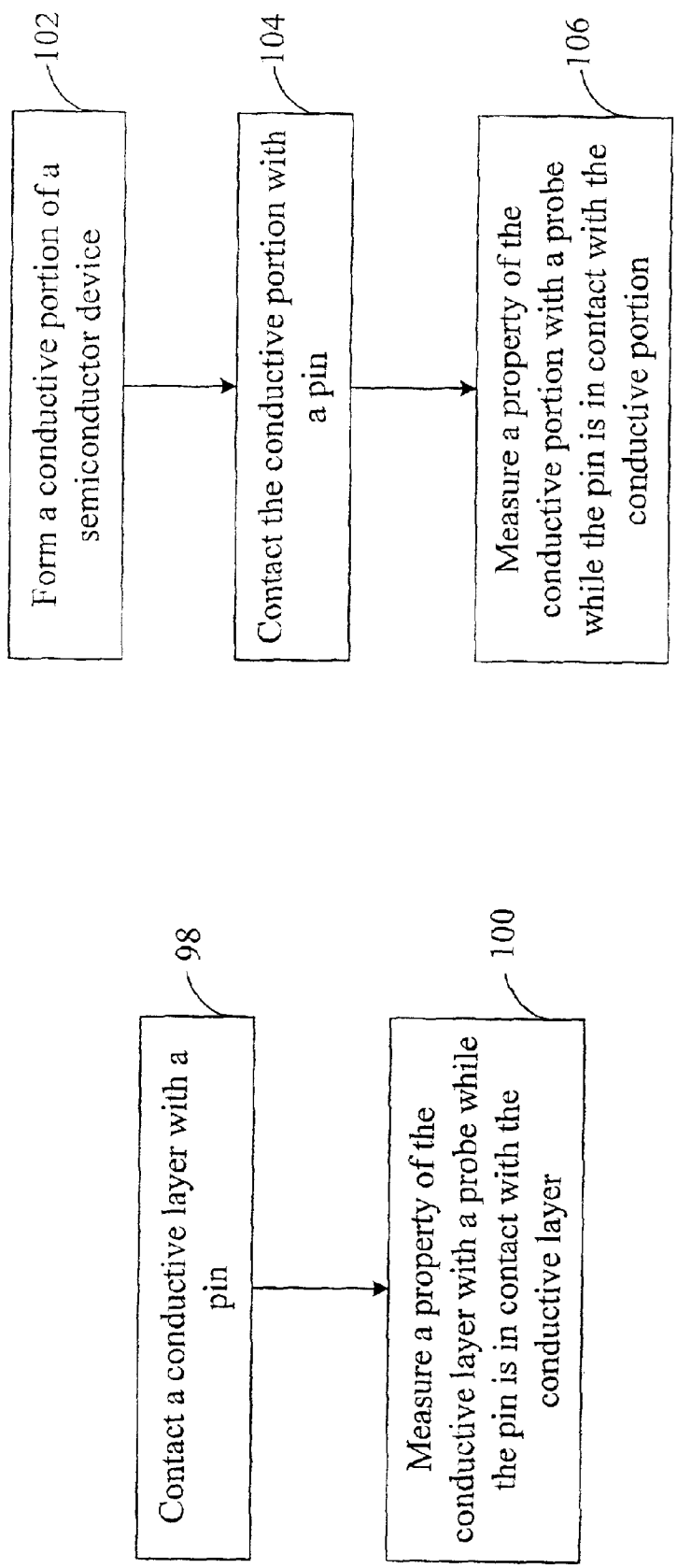

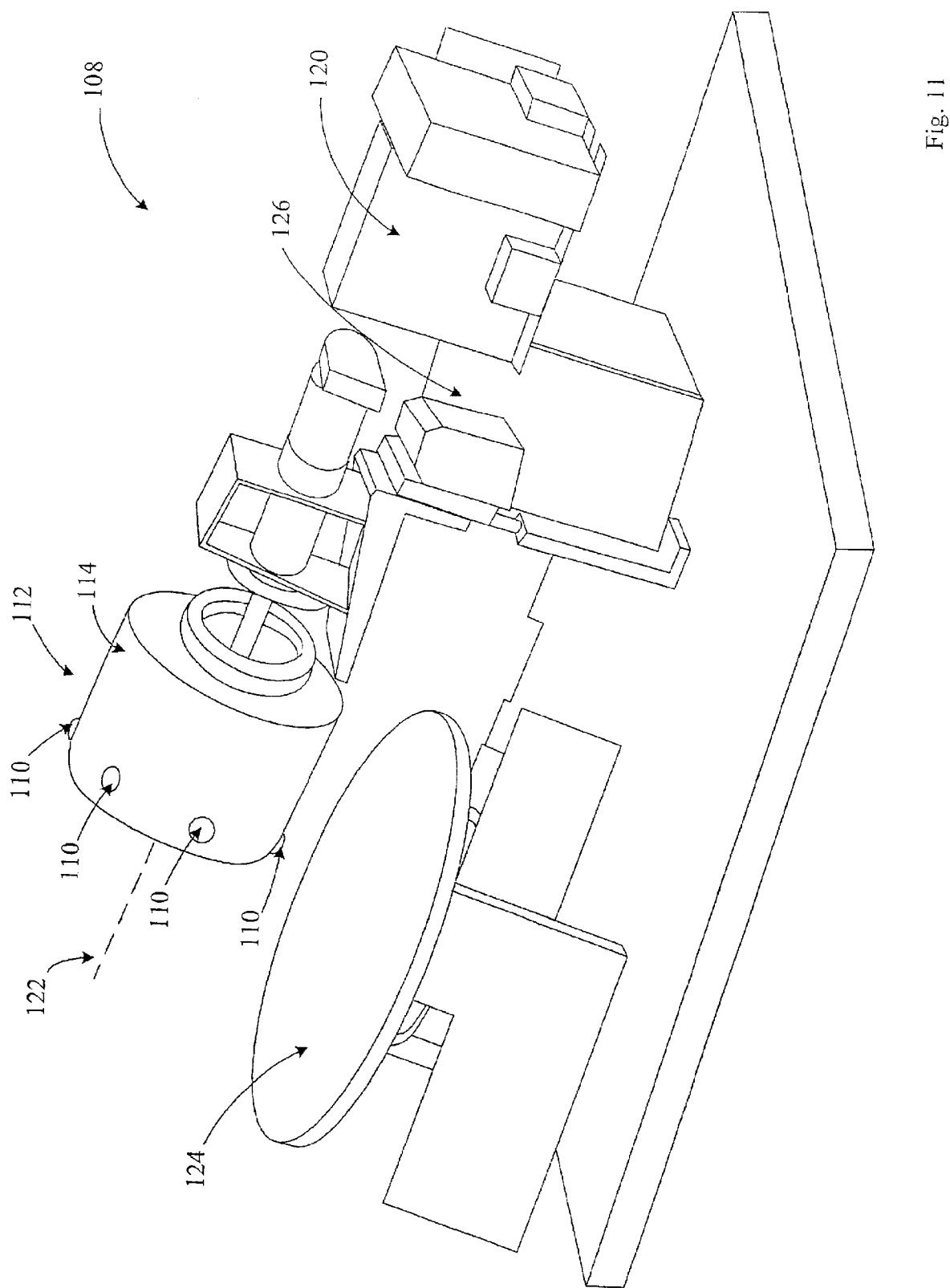

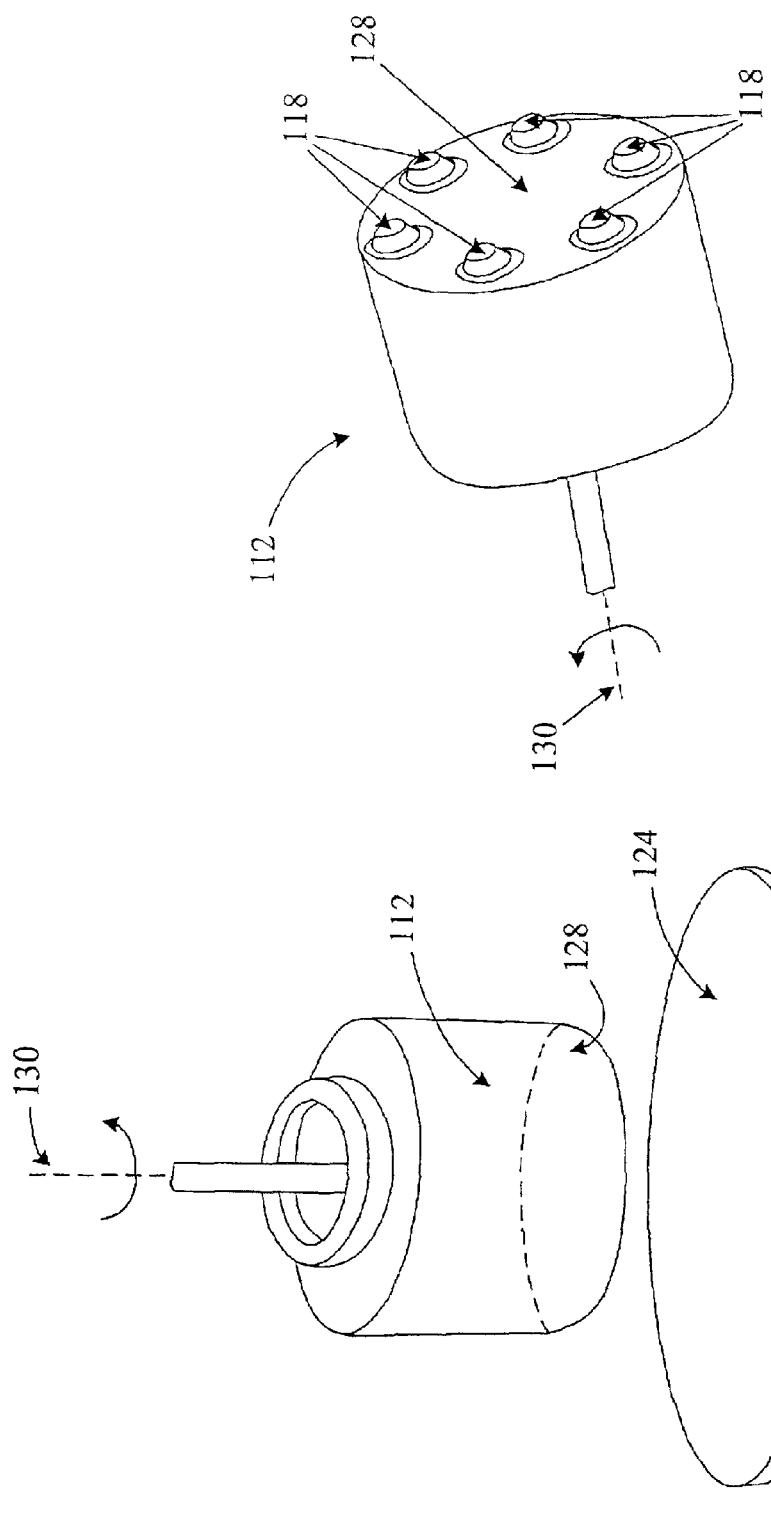

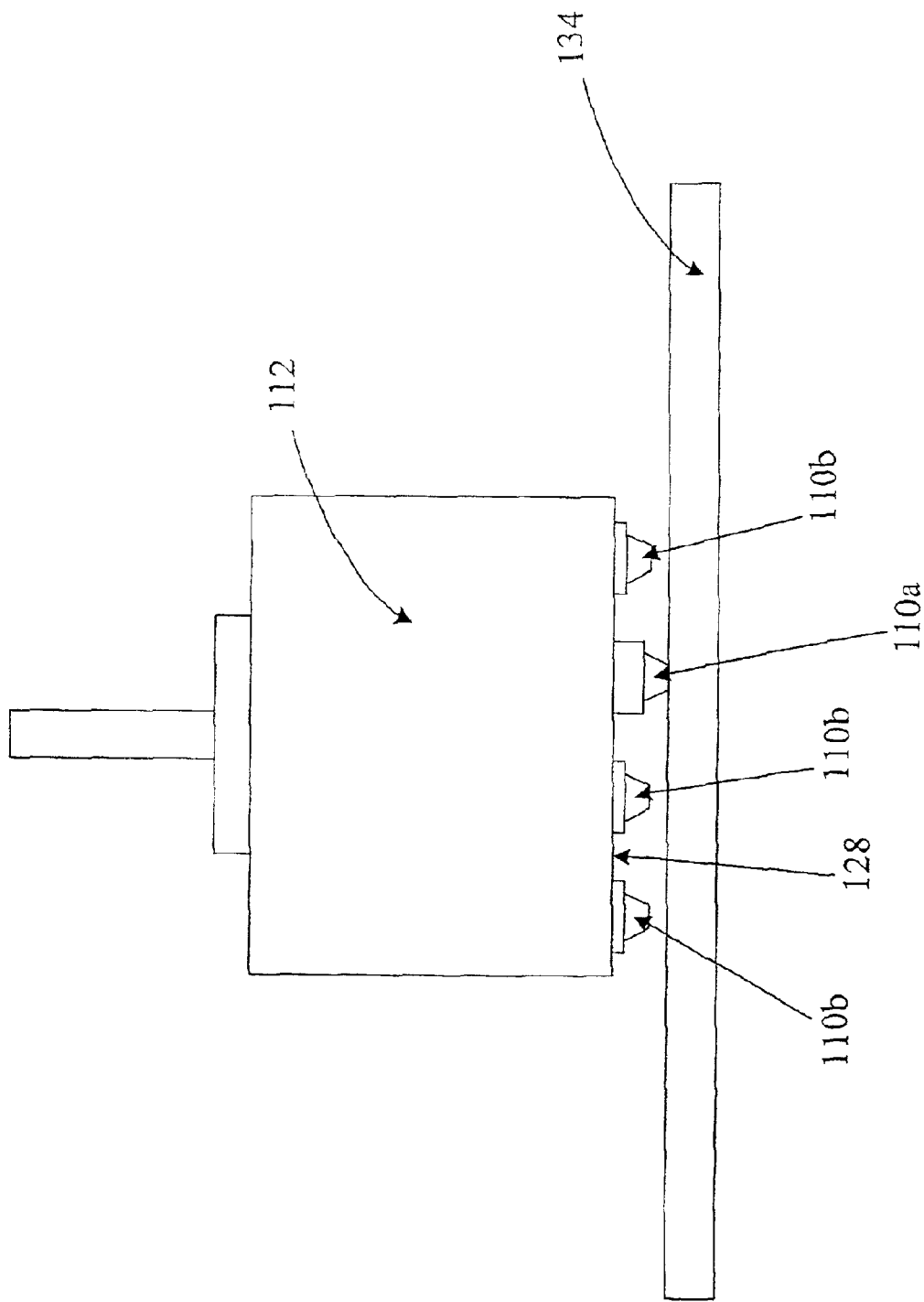

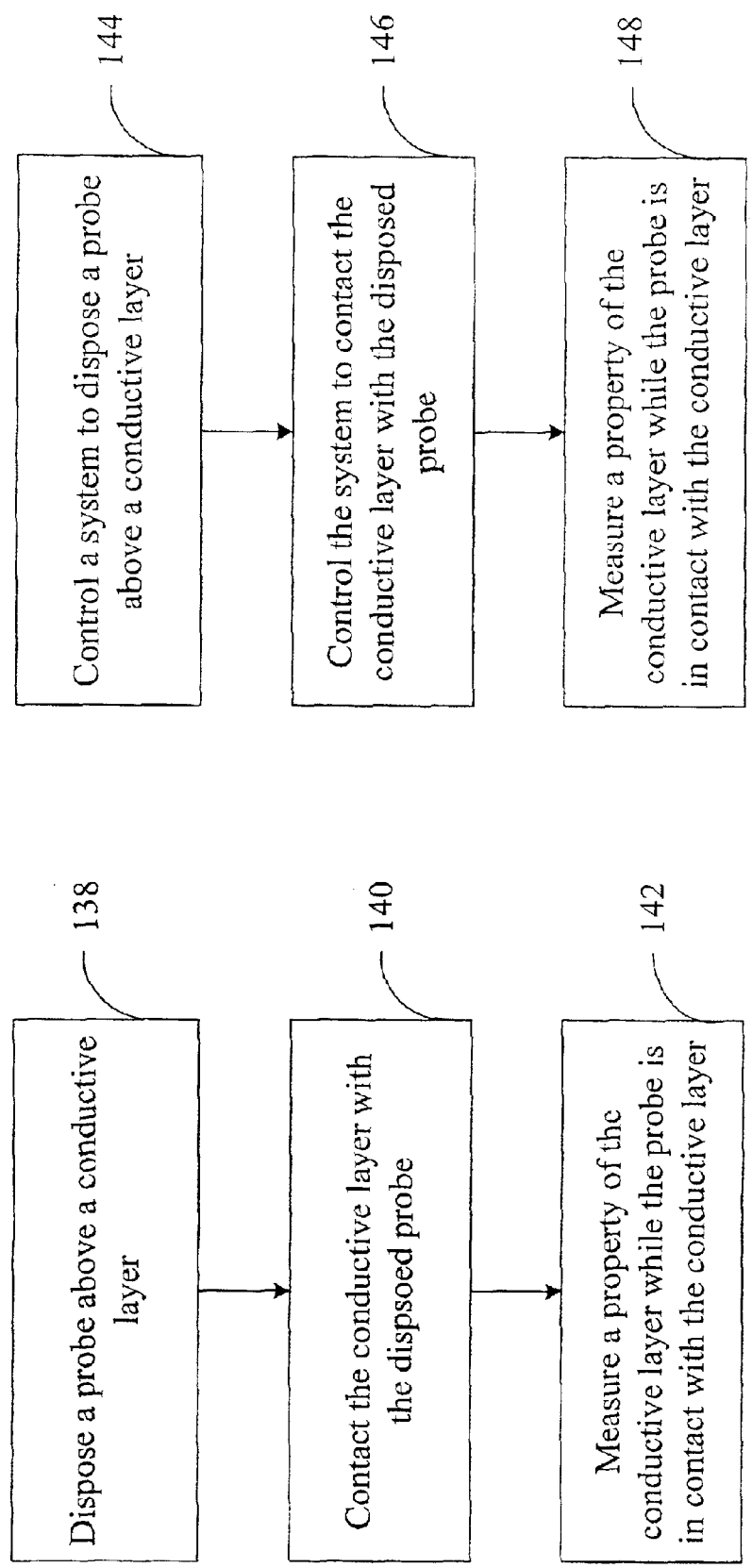

SYSTEMS AND METHODS FOR MEASURING PROPERTIES OF CONDUCTIVE LAYERS

PRIORITY CLAIM

This application claims priority to U.S. Provisional Application No. 60/282,676 entitled "Systems and Methods for Measuring Properties of Conductive Layers," filed Apr. 9, 2001.

BACKGROUND OF THE INVENTION

1. Field of the Invention

This invention generally relates to systems and methods for measuring properties of conductive layers. Certain embodiments relate to a pin having a substantially planar contact surface that may be disposed within a probe and a system that may include multiple probes configured to measure a property of a conductive layer.

2. Description of the Related Art

Semiconductor fabrication processes typically involve a number of processing steps to form various features and multiple levels of a semiconductor device. For example, ion implantation may be used to introduce impurity materials such as dopant ions into a region of a semiconductor substrate. An implanted region may form a junction of a semiconductor device such as lightly doped drain ("LDD") and source/drain ("S/D") junctions. Rapid thermal annealing may be used to electrically activate the implanted regions of the semiconductor substrate thereby substantially completing the formation of the junctions. Because ion implantation offers several advantages over diffusion doping, it is increasingly becoming an integral processing step of semiconductor fabrication.

Ion implantation systems may be among the most sophisticated and complex systems utilized in semiconductor fabrication. In order to be utilized efficiently, therefore, ion implantation systems may require extensive monitoring to ensure that such systems and ion implantation processes are performing within process constraints. For example, ion implantation processes may be monitored by assessing implant dose, implantation depth profile, uniformity of implant dose across a semiconductor substrate, and uniformity of implant dose across multiple semiconductor substrates. Ideally, extensive monitoring of ion implantation processes takes place during both process development and process control of manufacturing processes. For example, process control of ion implantation manufacturing processes may involve in situ monitoring of implant dose. Accurately monitoring implant dose, however, may be difficult because measurements of implant dose are generally based on integrating the beam current. Error sources may be introduced into measurement of an integrated beam current by interactions between the beam and electrons, neutrals, and negative ions as well as secondary particles which may be emitted as a result of ion bombardment of the target.

An additional process control method that may be used to monitor and assess an ion implantation process may involve determining sheet resistance of implanted regions of a semiconductor substrate using a four-point probe technique. The four-point probe technique may involve using a colinear probe arrangement, which may be positioned to contact implanted regions on the semiconductor wafer. The probe may include four pins that may be disposed in various arrangements. Suitable pins may be commercially available, for example, from Kulicke & Soffa Industries, Inc., Willow Grove, Pa. and Jandel Engineering Limited, England. During operation of the probe, a current may be passed between two outer pins, and a voltage drop may be measured across two inner pins. The measurement may be performed twice to eliminate thermoelectric heating and cooling errors in the measurements. For example, a first measurement may involve passing a current in a first direction, which may be referred to as the forward direction. A second measurement may involve passing a current in a second direction, which may be opposite to the first direction. The second direction may be referred to as the reverse direction. Voltage drop results from the two measurements may be averaged. In addition, a measurement may also be performed at several different current levels because measuring at an improper current may cause the forward and reverse results to differ or may cause the results to drift. Sheet resistance may be determined from the measured voltage drop and current. In addition, sheet resistance may be used to determine characteristics of an implanted region such as implant dose and implantation depth profile. Sheet resistance may also be used to determine characteristics of a conductive layer such as thickness.

Currently available systems that may be configured to determine sheet resistance of implanted semiconductor substrates and conductive layers using a four-point probe technique may include four pins. Each of the four pins may have a contact surface that contacts a conductive layer during measurement. The contact surface of each pin may be rounded or semi-circular. In this manner, a cross-sectional area of each pin, in a plane substantially parallel to the contact surface, may be smallest at the contact surface of the pin and may increase along a length of the pin extending laterally from the contact surface. In addition, the contact surface may be abraded due to contact between the pin and an upper surface of a conductive layer during measurement and a ceramic plate during conditioning. Therefore, since the cross-sectional area of the pin increases along a length of the pin, the surface area of the contact surface may also increase due to such abrasion.

Currently, a pin disposed within a probe may be conditioned until an appropriate surface area may be obtained. For example, a pin may be conditioned to increase a surface area of a contact surface of the pin until the surface area may be large enough to reduce a contact resistance of the pin. A contact resistance of the pin may be reduced such that the contact resistance may not adversely effect measurements. An appropriate surface area may be determined by monitoring improvements in the repeatability of measurements performed with the probe. For example, a surface area at which sufficiently low contact resistance may not be achieved may be determined by an inability to achieve improved probe qualification results after repeated probe conditioning. An appropriate surface area may also be determined by removing the probe from a measurement system and measuring a surface area of a contact surface of each pin within the probe. As such, determining an appropriate surface area may be very time consuming.

Once an appropriate surface area may be obtained, the probe may be used to measure a property of conductive layers. During such measurements, however, a surface area of the contact surface of the probe will continue to increase due to abrasion between the contact surface and a conductive layer. Such continual increases in surface area may also significantly limit the probe life because measurements performed with the probe may change over time. In addition, a pin may be used until the surface area of the contact surface may be larger than a surface area at which sufficiently low contact resistance may not be achieved. If a pin may not achieve a sufficiently low contact resistance, the pin may be replaced with a new pin. Alternatively, a pin which may not be able to achieve a sufficiently low contact resistance may be removed from the probe. A contact surface of the pin may be re-shaped, and the pin may be re-installed in the probe.

Additionally, a surface area of each of the contact surfaces of the four pins may not increase uniformly due to non-uniform abrasion between the contact surfaces of each of the four pins and a conductive layer or a conditioning plate. As such, variations in the results obtained from using such a probe may be more difficult to detect and correct. Furthermore, as the depth of implanted regions of a semiconductor substrate decreases, sheet resistance measurements of the implanted regions may become more dependent on the surface area of the contact surface. In this manner, a range of acceptable surface areas for the contact surfaces of the pins may be reduced. Therefore, pins which have rounded or spherical contact surfaces may have an increased probability of error and a significantly reduced lifetime for accurately measuring sheet resistance such implanted regions.

Currently available four point probe may be configured to accommodate only one probe at a time. Typically, each type of probe may be configured to perform only a subset of the measurements that may be required for fabricating a semiconductor device. For example, a probe may be configured to measure sheet resistance of a very thick metallization layer. Such a probe configuration, however, may not be appropriate for measuring sheet resistance of a lightly doped implanted region such as an ultra shallow junction. In this manner, performing different types of measurements may require manually removing and replacing the probe. As such, performing measurements typically required for semiconductor device fabrication may involve manually removing and replacing a probe approximately 10 times in approximately 8 hours such that different measurements may be performed. Therefore, an operator may spend a significant amount of time manually removing and replacing a probe depending on the number and the type of measurements that are performed with such a system. Furthermore, such routine manual operation may prevent using such systems in automated semiconductor fabrication facilities such as facilities, which may be used to fabricate semiconductor devices on 300 mm semiconductor substrates.

Manually removing and replacing a probe may also reduce process yield because manual operation of such systems may increase the potential for contamination of the system and contamination of semiconductor substrates processed in the system. In addition, manual operation of such systems may increase the potential for random error. For example, currently available systems may not be configured to determine the type of probe which is disposed within the system. Therefore, an operator may install the wrong probe in such a system and may unknowingly perform measurements for which the installed probe may not be suitable. Overall semiconductor device fabrication may also take longer due to manual operation of such systems. As such, overall cost of fabricating a semiconductor device may increase, and manufacturing capacity may decrease.

Currently available four point probe systems may also be configured for manual conditioning and qualification. Probe conditioning may be performed to remove contaminants on contact surfaces of a probe. For example, contact surfaces of a probe may have surface imperfections such as rough surfaces. Contamination, therefore, may accumulate in tiny crevices in the contact surfaces. As contamination accumulates on contact surfaces of the probe, contact between the contact surfaces and a semiconductor substrate degrades. Conditioning may involve manually inserting a small conditioning plate onto a platen proximate to the contact surfaces of the probe. The ceramic plate may be used to abrade the contact surfaces of the probe thereby removing contaminants from the contact surfaces. Subsequent to conditioning, qualification of the probe may be performed to determine if contamination has been sufficiently removed such that the probe may be used for measurement. Furthermore, conditioning and qualification may also need to be performed iteratively several times until the probe meets qualification standards. Conditioning and qualification may involve manually initiating loading and unloading of a semiconductor substrate and manually switching the system function between conditioning and qualification. In this manner, manually performing conditioning and qualification may take in excess of several hours to complete. Consequently, manual conditioning and qualification may be extremely costly and time consuming.

Accordingly, it may be advantageous to improve the performance of a system configured to measure a property of a conductive layer, for example, by reducing variation in surface area of contact surfaces of a probe and manual operation of the system.

SUMMARY OF THE INVENTION

An embodiment of the invention relates to a pin configured to be disposed within a probe. The probe may be configured to measure a property of a conductive layer. For example, the probe may be configured to measure sheet resistance and/or thickness of the conductive layer. The conductive layer may include an implanted region of a semiconductor substrate such as an ultra shallow junction. In addition, the conductive layer may be a layer formed on a semiconductor substrate such as a metallization layer or a feature formed on a semiconductor substrate such as a gate electrode. The conductive layer may also be formed on a semiconductor substrate having a diameter of greater than approximately 200 mm. The conductive layer may also include a metal film formed on a glass substrate having a diameter of approximately 200 mm to approximately 300 mm. The conductive layer, however, may include any appropriate conductive layer known in the art.

In an embodiment, the pin may include a contact surface configured to contact the conductive layer during measurement. The contact surface may be substantially planar. The pin may also have a first portion extending from the contact surface. The first portion of the pin may extend from the contact surface along an axis that may be substantially perpendicular to the contact surface. A cross-sectional area of the first portion, which may be defined in a direction substantially parallel to the contact surface, may also be substantially equal to a surface area of the contact surface across a length of the first portion of the pin. Therefore, since the cross-sectional area of the pin may be substantially constant along a length of the first portion, the surface area of the contact area may be substantially constant over time despite abrasion of the contact surface due to use such as measurements and conditioning.

In an embodiment, the contact surface of the pin may have a width of less than approximately 200 $\mu$m. The width may be defined as a lateral dimension of the contact surface in a plane of the contact surface. For example, in one embodiment, the contact surface may have a width of approximately 100 µm. The contact surface may also include an outer edge. The outer edge of the contact surface may have a substantially circular shape or a substantially square shape. Alternatively, the outer edge of the contact surface may have a shape of approximately one fourth of a circle. A length of the first portion of the pin may be greater than approximately 10 µm. The pin may include a metal or another suitable conductive material. For example, the pin may include tungsten carbide, tungsten carbide and stainless steel, and osnium.

In an embodiment, the probe may be a four point probe. For example, the probe may include a pin as described in above embodiments and three additional pins. The probe may be configured to pass a current between a first and a second of the four pins. In addition, the probe may be configured to measure a voltage drop across a third and a fourth of the four pins. The probe may be configured such that the pin and the three additional pins are disposed in a linear array. Alternatively, the pin may be configured such that the pin and the three additional pins are disposed in a two dimensional array. In an embodiment, each of the three additional pins may also be configured as described in above embodiments. For example, contact surfaces of each of the three additional pins may be substantially planar. In addition, contact surfaces of each of the three additional pins may be substantially coplanar with a contact surface of a pin as described in above embodiments. The pin and each of the three additional pins also may be individually coupled to a device such as a spring. In this manner, contact surfaces of the pin as described in above embodiments and contact surfaces of each of the three additional pins may be substantially coplanar during measurement. In addition, a first portion of each of the three additional pins extending from a contact surface of each pin may have a cross-sectional area which may be substantially parallel to the contact surface of each pin. Furthermore, the cross-sectional area of each of the three additional pins may be substantially equal to a cross-sectional area of a pin as described in above embodiments.

In an embodiment, the probe may include only one pin as described above in above embodiments. For example, a conductive portion of the pin may include four conductors. The four conductors may be arranged in a two dimensional array. Each of the four conductors may be coupled to an insulating portion of the pin such that the four conductors may be spaced apart by less than approximately 0.2 mm. The insulating portion of the pin may include an insulating support rod. The pin may also include four conductors coupled by an adhesive insulating material. Alternatively, the pin may include four conductors coupled to an insulating spacer. The adhesive insulating material and the insulating spacer may have thicknesses that may define a space between the four conductors. For example, the adhesive insulating material and the insulating spacer may have thicknesses of less than approximately 0.2 mm.

In an embodiment, the probe may include one of at least two probes coupled to a mounting device. Each of the probes may be configured to measure a property of a conductive layer. Each probe may also be further configured as described in above embodiments. The mounting device may be configured such that one of the probes is in contact with the conductive layer during measurement. The probe may be further configured to measure a property of a conductive layer within less than approximately 3 mm from an outer edge of a semiconductor substrate. For example, the probe may be configured to measure a property of a conductive layer within less than approximately 1 mm from an outer edge of a semiconductor substrate.

An additional embodiment may relate to a method for measuring a property of a conductive layer. The method may include contacting the conductive layer with a pin. The pin may include a contact surface and a first portion extending from the contact surface. The contact surface may be substantially planar. In this manner, contacting the conductive layer may include contacting the conductive layer with substantially an entire surface area of the contact surface. In addition, the first portion may include a cross-sectional area which may be substantially parallel to the contact surface. The cross-sectional area may be substantially equal to a surface area of the contact surface across a length of the first portion. The first portion may extend from the contact surface along an axis which may be substantially perpendicular to the contact surface. In this manner, contacting the conductive layer may include contacting the conductive layer such that the first portion of the pin is substantially perpendicular to an upper surface of the conductive layer. The pin may be further configured as described in any of the above embodiments. For example, the pin may be disposed within a probe. As such, the method may also include measuring the property of the conductive layer with the probe while the pin is in contact with the conductive layer.

In an embodiment, the probe may be configured as described in above embodiments. For example, the probe may be a four point probe. In this manner, the probe may include a pin and three additional pins as described in above embodiments. As such, the method may also include contacting the conductive layer with the pin and the three additional pins. In addition, the pin and the three additional pins may be substantially coplanar during measurement of the property of the conductive layer. In an embodiment, measuring the property of the conductive layer may include measuring the property of the conductive layer within less than approximately 3 mm from an outer edge of a semiconductor substrate. For example, the method may include measuring the property of the conductive layer within approximately 1 mm from an outer edge of a semiconductor substrate. The property may include any of the properties which are described herein. In addition, the conductive layer may include any of the conductive layers described herein.

An additional embodiment relates to a method for fabricating a semiconductor device and a semiconductor device fabricated by the method. The method may include forming a conductive portion of the semiconductor device upon a semiconductor substrate. For example, the conductive portion may include an implanted region of the semiconductor device such as an ultra shallow junction. In addition, the conductive portion may include a conductive layer such as a metallization layer. The method may further include contacting the conductive portion with a pin. The pin may be configured as described herein. Furthermore, the method may include measuring the property of the conductive portion with the probe while the pin is in contact with the conductive portion. For example, the measured property may include sheet resistance or thickness of the conductive layer.

A further embodiment relates to a system configured to measure a property of a conductive layer. The property of the conductive layer may include sheet resistance and/or thickness of the conductive layer. The conductive layer may include any of the conductive layers as described herein. The system may include at least two probes. Each probe may be configured to measure the property of the conductive layer. The system may also include a mounting device. At least the two probes may be coupled to the mounting device. The mounting device may be configured such that one of the probes may contact the conductive layer during measurement. In this manner, multiple probes may be arranged in a single system. The probes may be configured such that each probe may be appropriate for a different type of measurement. For example, a property of a conductive layer, which may be measured with a probe, may depend on characteristics of the probe such as a lateral dimension of the contact surface of pins arranged within the probe. In an embodiment of the system, therefore, different types of measurements may be performed without manually replacing the probes.

In an embodiment, each probe may include four pins. Each probe may be configured to pass a current between a first and a second of the four pins. Each probe may also be configured to measure a voltage drop across a third and a fourth of the four pins. Each of the four pins may include a contact surface. The contact surface of each pin may be configured to contact the conductive layer during measurement. In addition, the contact surface of each pin may substantially planar. Each pin may also include a first portion extending from the contact surface. The first portion of each pin may have a cross-sectional area which may be substantially parallel to the contact surface. The cross-sectional area of each first portion across substantially an entire length of the first portion may be substantially equal to a surface area of the contact surface of each pin. Each pin may be further configured as described herein. The probe may be further configured as described herein.

In an embodiment, the system may be configured to measure a property of a conductive layer within less than approximately 3 mm from an outer edge of a semiconductor substrate. For example, the system may be configured to measure a property of a conductive layer within approximately 1 mm from an outer edge of a semiconductor substrate.

In an embodiment, the mounting device may include a nonlinear external surface. Each probe may be coupled to the mounting device such that a portion of each probe may extend from the nonlinear external surface. The mounting device may be further configured to rotate such that a contact surface of one of the probes may be spaced above an upper surface of the conductive layer. The mounting device may also be configured such that a contact surface of a probe spaced above an upper surface of the conductive layer may be substantially parallel to the upper surface of the conductive layer. For example, the mounting device may be configured to move rotatably around an axis which may be substantially parallel to an upper surface of the conductive layer. In this manner, the mounting device may be configured to position one of the probes above an upper surface of the conductive layer. In addition, the mounting device may be further configured to move linearly to alter a distance between one of the probes and the conductive layer. For example, the mounting device may also be coupled to a motorized device which may be configured to move the mounting device. As such, the mounting device may be configured to contact an upper surface of a conductive layer with a probe positioned above the upper surface of the conductive layer.

In an alternative embodiment, the mounting device may include a planar external surface. The mounting device may be disposed above the conductive layer such that the planar external surface may be substantially parallel to and spaced above an upper surface of a conductive layer. In addition, each of the probes may be coupled to the mounting device such that a portion of each probe may extend from the external surface. In this manner, the mounting device may be configured such that a contact surface of each probe may be spaced above an upper surface of the conductive layer. The mounting device may also be configured such that a contact surface of each probe may be substantially parallel to an upper surface of the conductive layer. The mounting device may also be configured to move rotatably around an axis which may be substantially perpendicular to an upper surface of the conductive layer. In this manner, the mounting device may be configured to position one of the probes above an area of interest within a conductive layer. The mounting device may also include a solenoid coupled to each probe. The solenoid may be configured to alter a position of one of the probes such that one of the probes may be in contact with the conductive layer during measurement. For example, the solenoid may be configured to move a probe positioned above a conductive layer toward an upper surface of the conductive layer such that the positioned probe may contact the conductive layer.

In an embodiment, the system may also include at least one resistor pack coupled to the mounting device. The resistor pack may be configured to calibrate electronics of the system such as a voltmeter and a current source. For example, the system may include three probes and three resistor packs. Each of the resistor packs may be configured to calibrate electronics of the system. The system may also include a probe simulator which may be configured to calibrate at least the two probes.

In an additional embodiment, the system may include a stage which may be configured to support a semiconductor substrate. The stage may also be configured to move the semiconductor substrate with respect to the mounting device. The system may also be configured to transfer a semiconductor substrate into the system through a standard mechanical interface ("SMIF") or through a front opening unified pod ("FOUP"). For example, the system may be configured to transfer the semiconductor from the SMIF or from the FOUP onto a stage as described above. The conductive layer may be formed on the semiconductor substrate. In this manner, the system may be installed within a substantially completely automated semiconductor fabrication facility. Therefore, the system may be configured to measure a property of a conductive layer formed on a semiconductor substrate having a diameter of approximately 300 mm.

In an embodiment, the system may also include a conditioning plate. The conditioning plate may be formed of ceramic, lapped silicon, or sapphire. The conditioning plate may be configured to move against a surface of at least one of the probes such that contaminants may be removed from the surface. In addition, the system may include a controller computer coupled to the conditioning plate. Controller software executable on the controller computer may be operable to implement a method for controlling the conditioning plate. The system may also include a controller computer coupled to the system. The controller computer may also be coupled to the conditioning plate as described above. The controller computer may also include controller software executable on the controller computer may be operable to implement a method for controlling the system. For example, the controller software may be operable to implement a method for qualifying the probes subsequent to conditioning. Therefore, the system may be configured to perform substantially automated conditioning and qualification of each of the probes. Conditioning and qualification may be an iterative process requiring several cycles before a measurement may be performed. Therefore, an automated conditioning and qualification process may be performed in substantially less time than the time typically required to perform conditioning and qualification manually.

In an embodiment, the controller software may also be operable to implement a method for applying at least two substantially different currents to at least one of the probes. The method may also include measuring a voltage drop of the probe subsequent to applying each current. In addition, the method may include determining a minimum standard deviation of the measured voltage drop and an applied current associated with the determined minimum standard deviation. As such, the controller software may be operable to implement a method for optimizing the current applied to a probe before measuring a property of a conductive layer with the system.

In an embodiment, the controller computer may also be coupled to a mounting device as described in any of the above embodiments. Controller software executable on the controller computer may be operable to implement a method for controlling the mounting device. For example, the controller software may be operable to implement a method for determining an identity and a position of each probe within the mounting device. In addition, the controller software may be operable to implement a method for determining an identity of a probe selected to measure the property of a conductive layer. For example, the method may include receiving input from a user that may be representative of a probe selected to measure the property of a conductive layer. Input from the user may also include a selected program that may include instructions for measuring a property of a conductive layer. The instructions may include an identity of a probe, which may be appropriate for measuring the property of the conductive layer. The method may also include determining a position of the selected probe within the mounting device. In addition, the controller software may be further operable to implement a method for altering a position of the mounting device such that the selected probe may contact the conductive layer during measurement. For example, the controller computer may be coupled to a motorized device coupled to the mounting device. In addition, the controller software may be operable to implement a method for controlling the motorized device to move the mounting device such that the selected probe may contact the conductive layer. As such, the system may be configured to perform substantially automated selection and exchange of probes.

An additional embodiment may relate to a method for measuring a property of a conductive layer. The method may include disposing a probe above a conductive layer. The probe may be coupled to a mounting device. In addition, the mounting device may include at least two probes. The method may also include contacting the conductive layer with the disposed probe. The method may further include measuring the property of the conductive layer with the probe while the probe is in contact with the conductive layer.

The probes may be configured as described in any of the above embodiments. For example, each probe may include four pins. In an embodiment, the method may include passing a current between a first and a second of the four pins. In addition, the method may include measuring a voltage drop across a third and a fourth of the four pins. The method may also include contacting a conductive layer with a contact surface of each of the four pins of a probe disposed above the conductive layer. Alternatively, each probe may include one pin. In this manner, the method may include contacting a conductive layer with a contact surface of one pin of a probe disposed above the conductive layer. Measuring the property of the conductive layer may include measuring a property of a conductive layer within less than approximately 3 mm from an outer edge of a semiconductor substrate. For example, measuring the property of the conductive layer may include measuring a property of a conductive layer within approximately 1 mm from an outer edge of a semiconductor substrate.

In an embodiment, the mounting device may include a nonlinear external surface. In addition, each probe may be coupled to the mounting device such that a portion of each probe may extend from the nonlinear external surface. In this manner, the method may include rotating the mounting device such that a contact surface of one of the probes may be spaced above an upper surface of the conductive layer. In addition, the method may include rotating the mounting device such that a contact surface of a probe spaced above an upper surface of a conductive layer may be substantially parallel to the upper surface of the conductive layer. For example, disposing the probe above the conductive layer may include rotating the mounting device around an axis that may be substantially parallel to an upper surface of the conductive layer. As such, the mounting device may be configured to position one of the probes above an upper surface of the conductive layer. In addition, contacting the conductive layer with the disposed probe may include moving the mounting device linearly to alter a distance between one of the probes and the conductive layer. For example, the method may include moving the mounting device with a motorized device. As such, the method may include contacting an upper surface of a conductive layer with a probe positioned above the upper surface of the conductive layer.

In an alternative embodiment, the mounting device may include a substantially planar external surface. The mounting device may be disposed above the conductive layer such that the substantially planar external surface may be substantially parallel to and spaced above an upper surface of a conductive layer. In addition, each of the probes may be coupled to the mounting device such that a portion of each probe may extend from the external surface. The portion of each probe extending from the external surface may include at least a contact surface of the probe. In this manner, the method may include disposing a contact surface of a probe above an upper surface of the conductive layer. In addition, the mounting device may be disposed above an upper surface of a conductive layer such that a contact surface of each probe is substantially parallel to an upper surface of the conductive layer. Disposing the probe above the conductive layer may include rotating the mounting device around an axis which may be substantially perpendicular to an upper surface of the conductive layer. In this manner, the method may include positioning one of the probes above an area of interest within a conductive layer. The mounting device may also include a solenoid coupled to each probe. Contacting the conductive layer with the probe may include altering a position of one of the probes such that one of the probes may be in contact with the conductive layer during measurement.

In an embodiment, the method may include calibrating electronics of the system with at least one resistor pack. The resistor pack may be coupled to the mounting device. In addition, the method may include calibrating at least one of the probes with a probe simulator. In an additional embodiment, the method may include supporting a semiconductor substrate with a stage. The method may also include moving a semiconductor substrate with respect to the mounting device with a stage. The method may further include transferring a semiconductor substrate into the system from a SMIF or from a FOUP to a stage. The conductive layer may be formed on the semiconductor substrate.

In an embodiment, the method may include moving a conditioning plate against a surface of a probe to remove contaminants from a contact surface of pins in the probe. In addition, the method may include controlling the conditioning plate with controller software executable on a controller computer to remove contaminants from a surface of a probe. The controller computer may be configured as described herein. In addition, the method may include qualifying a probe subsequent to conditioning with controller software executable on a controller computer. In an embodiment, the method may include controlling the system with controller software executable on a controller computer. For example, controlling the system may include applying at least two substantially different currents to a probe. Controlling the system may also include measuring a voltage drop of the probe subsequent to applying each current. In addition, controlling the system may include determining a minimum standard deviation of the measured voltage drop and an applied current associated with the determined minimum standard deviation. As such, the method may include controlling the system to optimize a current applied to a probe prior to measuring a property of a conductive layer with the probe.

In an embodiment, the method may include controlling the mounting device with controller software executable on a controller computer. In addition, the method may include determining an identity and a position of each probe within the mounting device with controller software executable on the controller computer. The method may also include determining an identity of a probe selected to measure the property of a conductive layer and a position of the selected probe within the mounting device with controller software executable on a controller computer. For example, the method may include receiving input from a user that may be representative of a probe selected to measure the property of a conductive layer. Input from the user may also include a selected program that may include instructions for measuring a property of a conductive layer. The instructions may include an identity of a probe that may be used for measuring the property of the conductive layer. In addition, disposing the probe above the conductive layer may include altering a position of the mounting device within controller software executable on a controller computer such that the selected probe is disposed above the conductive layer.

Additional embodiments may relate to a method for fabricating a semiconductor device and a semiconductor device fabricated by the method. The method may include forming a conductive portion of the semiconductor device upon a semiconductor substrate. The method may also include disposing a probe above the conductive portion. The probe may be configured as described above. For example, the probe may be coupled to a mounting device. In addition, the mounting device may be configured as described in above embodiments. For example, the mounting device may include at least two probes. The method may further include contacting the conductive portion with the disposed probe. Furthermore, the method may include measuring the property of the conductive portion with the probe while the probe is in contact with the conductive portion of the semiconductor device.

An additional embodiment may relate to a computer-implemented method for controlling a system configured to measure a property of a conductive layer. The method may include controlling the system to dispose a probe above the conductive layer. The probe may be coupled to a mounting device. The mounting device may include at least two probes. The probe and the mounting device may also be further configured as described in above embodiments. The method may also include controlling the system to contact the conductive layer with the disposed probe. In addition, the method may include measuring a property of a conductive layer with the probe in contact with the conductive layer. Furthermore, the computer-implemented method may include any of the embodiments as described above. For example, the computer-implemented method may include controlling a conditioning plate to remove contaminants from a surface of at least one of the probes.

In an additional embodiment, a system may include at least two probes, a mounting device, a controller computer coupled to at least the mounting device, and controller software executable on the controller computer. The controller software may be operable to implement a computer-controlled method to control the mounting device. The controller software may also be operable to implement a computer-controlled method to control additional components of the system such as a conditioning plate and a stage. In an embodiment, the computer-controlled method may be implemented by program instructions which may be computer-executable and may be incorporated into a carrier medium.

BRIEF DESCRIPTION OF THE DRAWINGS

Other objects and advantages of the invention will become apparent upon reading the following detailed description and upon reference to the accompanying drawings in which:

FIGS. 1A and 1B depict schematic side views of a pin having a substantially planar contact surface;

FIG. 2A depicts a schematic bottom view of a pin in which an outer edge of a contact surface of the pin has a substantially circular shape;

FIG. 2B depicts a schematic bottom view of a pin in which an outer edge of a contact surface of the pin has a substantially square shape;

FIG. 2C depicts a schematic bottom view of a pin in which an outer edge of a contact surface of the pin has a shape of approximately one fourth of a circle;

FIG. 6A depicts a schematic cross-sectional view of a pin having four conductors coupled to an insulating support rod;

FIG. 6B depicts a schematic cross-sectional view of an insulating support rod having holes configured to surround wiring;

FIG. 6C depicts a schematic cross-sectional view of a pin having four conductors coupled by an adhesive insulating material;

FIG. 6D depicts a schematic cross-sectional view of a pin having four conductors coupled to an insulating spacer;

FIG. 7A depicts a schematic side view of an insulating spacer;

FIG. 7B depicts a schematic bottom view of an insulating spacer;

FIG. 8A depicts a schematic bottom view of a pin having four conductors in which an outer edge of a contact surface of each conductor has a shape of approximately one fourth of a circle;

FIG. 8B depicts a schematic bottom view of a pin having four conductors in which an outer edge of a contact surface of each conductor has a substantially circular shape;

FIG. 8C depicts a schematic bottom view of a pin having four conductors in which an outer edge of a contact surface of each conductor has a substantially square shape;

FIG. 9 depicts a flow chart illustrating a method for measuring a property of a conductive layer;

FIG. 10 depicts a flow chart illustrating a method for fabricating a semiconductor device;

FIG. 11 depicts an isometric view of a system having at least two probes configured to measure a property of a conductive layer and a mounting device configured to rotate such that a contact surface of one of the probes may be spaced above an upper surface of the conductive layer;

FIG. 15 depicts an isometric view of a system having at least two probes configured to measure a property of a conductive layer and a mounting device configured such that a contact surface of each probe may be spaced above an upper surface of the conductive layer;

FIG. 16 depicts an isometric view of a mounting device configured such that a contact surface of each probe may be spaced above an upper surface of a conductive layer; and FIG. 17 depicts a schematic side view of a mounting device configured to alter a position of at least one probe such that at least one probe may be in contact with a conductive layer during measurement;

FIG. 18 depicts a flow chart illustrating a method for measuring a property of a conductive layer;

FIG. 19 depicts a flow chart illustrating a method for controlling a system configured to measure a property of a conductive layer.

Figure 1A:
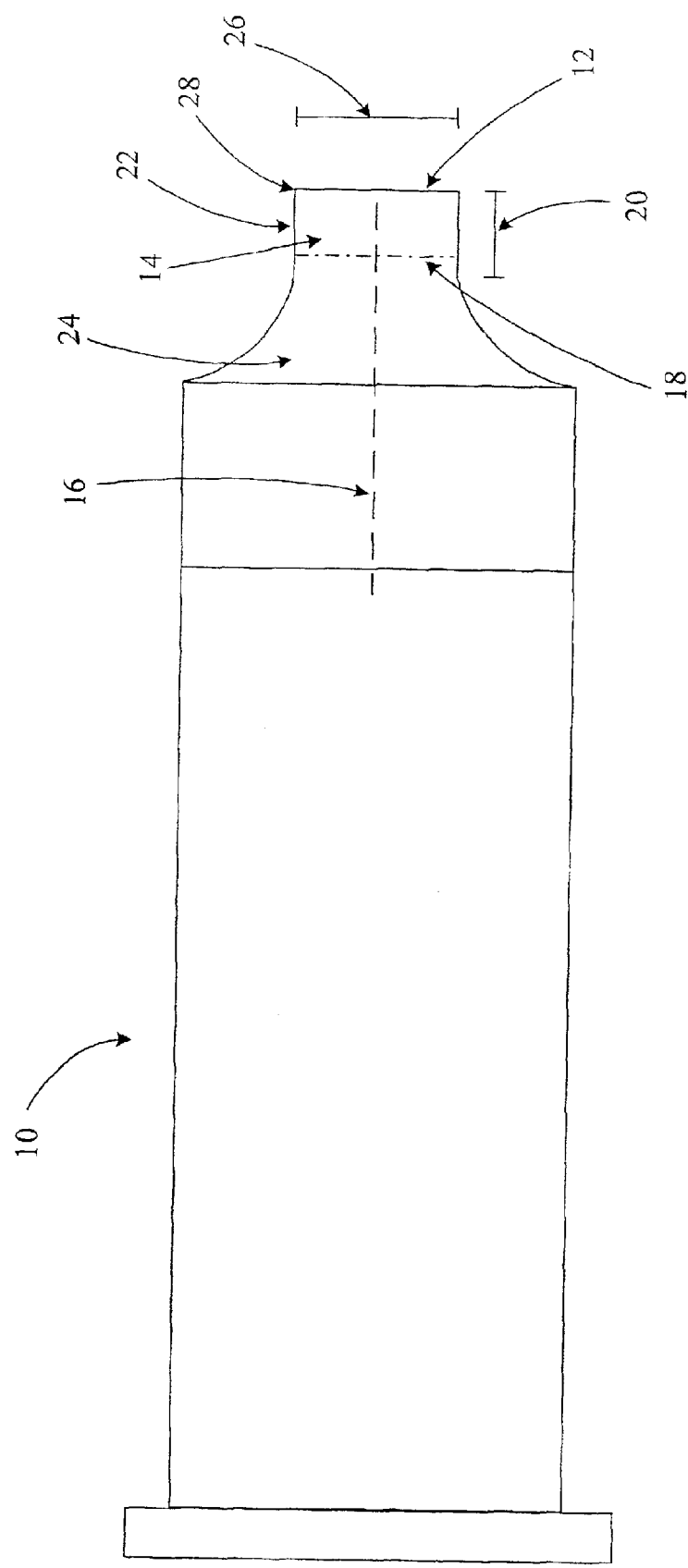

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1A illustrates a schematic side view of an embodiment of pin 10 configured to be disposed within a probe. For example, pin 10 may be disposed within a probe configured to measure a property of a conductive layer. A property of a conductive layer may include sheet resistance and/or thickness of a conductive layer. A conductive layer may include a metal film formed on a glass substrate having a diameter of approximately 200 mm to approximately 300 mm. In addition, a conductive layer may include an implanted region of a semiconductor substrate such as a lightly doped drain junction, a source/drain junction, and an ultra shallow junction. The conductive layer may also include a conductive structure formed upon a semiconductor substrate such as a gate electrode and a local interconnect. Additionally, the conductive layer may include a layer formed upon a semiconductor substrate such a metallization layer. In this manner, the conductive layer may include silicon, polysilicon, aluminum, copper, an aluminum-copper alloy, tungsten, titanium, titanium nitride, and a titanium-tungsten alloy. The conductive layer, however, may also include any conductive layer known in the art.

The conductive layer may be formed upon a semiconductor substrate having a diameter greater than or equal to approximately 200 mm. For example, the semiconductor substrate may have a diameter of approximately 300 mm. The semiconductor substrate may preferably be silicon, and may be doped either n-type (for producing a p-channel transistor) or p-type (for an n-channel transistor). More specifically, the semiconductor substrate may be an epitaxial silicon layer grown on a monocrystalline silicon substrate, or an n-type or p-type well region formed in a monocrystalline silicon substrate. Appropriate substrates may also include silicon germanium, gallium arsenide, and glass.

Pin 10 may include a metal or another suitable conductive. For example, pin 10 may include tungsten carbide, a tungsten carbide tip welded to a stainless steel pin, stainless steel, titanium carbide, and osmium. Pin 10 may also include contact surface 12 configured to contact a conductive layer during measurement. Contact surface 12 may be substantially planar. In this manner, contact surface 12 may be configured to contact a conductive layer such that substantially an entirety of the surface area of contact surface 12 may be in contact with a conductive layer during measurement. Pin 10 may also include first portion 14 of the pin extending from contact surface 12. First portion 14 may extend from contact surface 12 along axis 16 which may be substantially perpendicular to contact surface 12. As such, the contact surface may be configured to contact a conductive layer such that the first portion of the pin may be substantially perpendicular to an upper surface of a conductive layer. Cross-sectional area 18 of first portion 14, which may be defined in a plane substantially parallel to contact surface 12, may be substantially equal to a surface area of contact surface 12 across length 20 of first portion 14. As such, an exterior surface may be substantially uniform across length 20 of first portion 14. For example, first portion 14 may include an exterior surface 22 which may be substantially cylindrical or substantially square.

Contact surface 12 may be abraded during measurement, conditioning, and other such conventional use. Because contact surface 12 may be substantially planar, the contact surface may be subject to substantially uniform abrasion across substantially an entire surface area of the contact surface. Consequently, a surface area of contact surface 12 may be substantially planar over substantially an entire lifetime of pin 10. In addition, as contact surface 12 is abraded over time, a length of first portion 14 may be reduced. In this manner, contact surface 12 may be defined at the end of the reduced length of first portion 14. Therefore, as contact surface 12 is abraded over time, the contact surface may have a surface area that may be substantially equal to a cross-sectional area at various positions along length 20 of first portion 14. In this manner, because cross-sectional area 18 of first portion 14 may be substantially uniform throughout length 20 of first portion 14, a surface area of contact surface 12 may be substantially constant despite abrasion of the contact surface. Length 20 of first portion 14 may also be substantially greater than an amount of the first portion that may wear away by such abrasion over a lifetime of pin 10. For example, length 20 may be greater than approximately 10 µm. Consequently, a surface area of contact surface 12 may be substantially constant over a lifetime of pin 10.

In addition, because a surface area of contact surface 12 may be substantially constant despite abrasion of the contact surface, conditioning of the pin may be performed without removing pin 10 from a probe. In contrast, a surface area of a contact surface of a conventional pin may increase due to conditioning. In this manner, such a conventional pin may need to be removed from a probe for reshaping. Reshaping may include reducing a surface area of the contact surface such that a sufficiently low contact resistance may be achieved. Such a conventional pin may be reinstalled in a probe for additional use. Because a surface area of contact surface 12 may be substantially constant over a lifetime of pin 10, however, pin 10 may not need such reshaping to alter a surface area of the contact surface. As such, conditioning of pin 10 may be performed without removing the pin from a probe.

Pin 10 may also include second portion 24 of pin 10 extending from first portion 14 of the pin. Because length 20 of first portion 14 may be substantially greater than an amount of the first portion that may wear away due to abrasion, a surface area of contact surface 12 may be substantially independent of dimensions of second portion 24 such as length and cross-sectional area. As such, second portion 24 may have substantially any length and cross-sectional area. For example, a length and a cross-sectional area of second portion 24 of the pin may vary depending on a process used to manufacture pin 10. For example, as shown in FIG. 1A, second portion 24 of pin 10 may have a nonlinear external surface. In this manner, a cross-sectional area of the second portion may vary across a length of the second portion. FIG. 1B illustrates a schematic side view of an alternative embodiment of pin 10. As shown in FIG. 1B, second portion 24 may have a substantially cylindrical outer surface. Therefore, a cross-sectional area of second portion 24 may be substantially constant over a length of the second portion. As further shown in FIG. 1B, however, a cross-sectional area of second portion 24 may be substantially different than cross-sectional area 18 of first portion 14. Additional features of pin 10 illustrated in FIG. 1B, which may be configured as described and illustrated in FIG. 1A, have been indicated by the same reference characters.

In an embodiment, contact surface 12 of pin 10 may have width 26 of less than approximately 200 µm. For example, the contact surface may have a width of approximately 100 µm. A width of contact surface 12, however, may be larger or smaller depending on, for example, characteristics of a conductive layer to be measured with a probe and characteristics of the probe. For example, a contact resistance of pin 10 may increase as a width of contact surface 12 increases. In addition, a conductive layer may be measured with a probe having a contact resistance below a predetermined contact resistance. The predetermined contact resistance may vary depending on characteristics of the conductive layer. In this manner, an appropriate width of contact surface 12 may depend on characteristics of conductive layer being measured. Contact surface 12 may also include outer edge 28. Outer edge 28 may surround substantially an entirety of contact surface 12 thereby defining a surface area of the contact surface. For example, FIGS. 2A, 2B, and 2C illustrate schematic bottom views of embodiments of pin 10 in which outer edge 28 may define a surface area of contact surface 12. As shown in FIG. 2A, outer edge 28 may have a substantially circular shape. Alternatively, as shown in FIG. 2B, outer edge 28 of contact surface 12 may have a substantially square shape. In addition, as shown in FIG. 2C, outer edge 28 of contact surface 12 may have a shape of approximately one fourth of a circle.

Figure 3B:
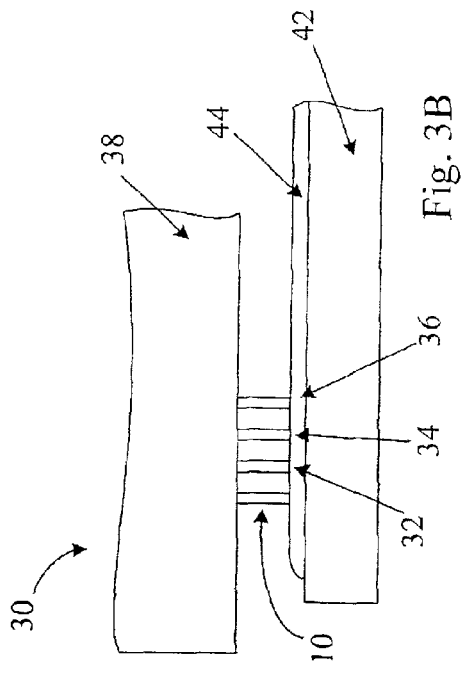
FIG. 3B depicts an exploded schematic side view of a four point probe having four pins disposed in a linear array.
Figure 3A:
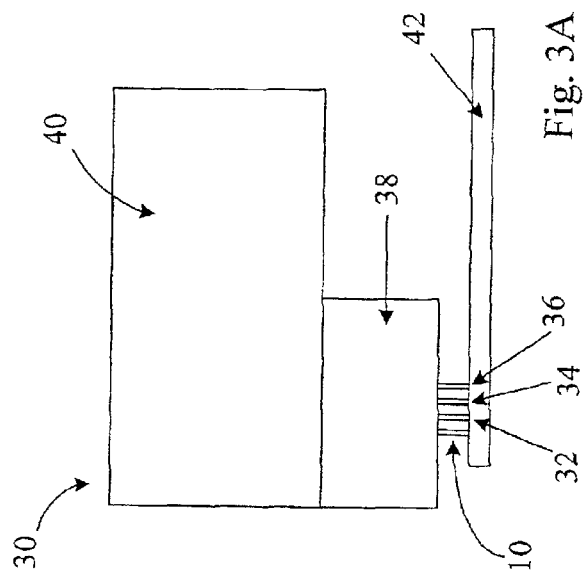
FIG. 3A depicts a schematic side view of a four point probe having four pins disposed in a linear array.

FIG. 3A illustrates a schematic side view of an embodiment of system 30 in which pin 10 may be disposed. In an embodiment, system 30 may be configured to measure a property of a conductive layer using a four point probe technique. For example, probe 38 may include pin 10 and three additional pins 32, 34, and 36. The pin and the three additional pins may be disposed within probe 38. The pin and the three additional pins may also be securely coupled within probe 38 by a clamping mechanism or another suitable mechanism. Probe 38 may also be securely coupled to probe head 40. Probe head 40 may be configured to position probe 38 with respect to semiconductor substrate 42. FIG. 3B illustrates an exploded schematic view of an embodiment of system 30. As shown in FIG. 3B, pin 10 and additional pins 32, 34, and 36 may be configured to contact conductive layer 44, which may be formed upon semiconductor substrate 42 or another suitable substrate such as glass. As described in above embodiments, conductive layer 44 may also be formed within semiconductor substrate 42. For example, a conductive layer may include an implanted region of semiconductor substrate 42. As shown in FIGS. 3A and 3B, pin 10 and additional pins 32, 34, and 36 may be disposed in a linear array.

Figure 4B:
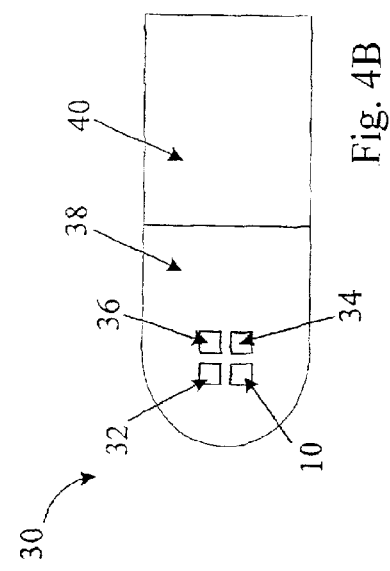
FIG. 4B depicts a schematic bottom view of a four point probe having four pins disposed in a two dimensional array.
Figure 4A:
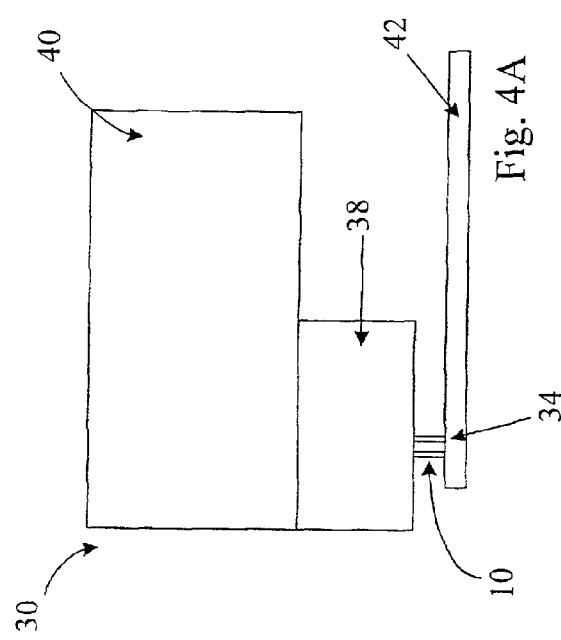
FIG. 4A depicts a schematic side view of a four point probe having four pins disposed in a two dimensional array.

FIG. 4A illustrates a schematic side view of an alternative embodiment of system 30 in which pin 10 may be disposed. As shown in FIG. 4A, pin 10 and additional pins 32, 34, and 36 may be disposed in a two dimensional array within probe 38. FIG. 4B illustrates a schematic bottom view of system 30 in which pin 10 and additional pins 32, 34, and 36 may be disposed in a two dimensional array. Additional elements shown in FIGS. 4A and 4B, which may be configured as described and illustrated in FIGS. 3A and 3B, have been indicated by the same reference characters. In an embodiment, system 30 may be configured to pass a current between pin 10 and additional pin 36. In addition, system 30 may be configured to measure a voltage drop across additional pin 32 and additional pin 34. System 30 may also be configured to pass a current between additional pin 32 and additional pin 34 and to measure a voltage drop across pin 10 and additional pin 36. The voltage drop measurements may be used to eliminate thermoelectric heating and cooling errors or edge effects in the measurements. In an alternative embodiment, system 30 may be configured to pass a current between pin 10 and additional pin 34 and to measure a voltage drop across additional pin 32 and additional pin 36. The measured voltage drop may be used to determine a sheet resistance of a conductive layer. In addition, sheet resistance may used to determine characteristics of a conductive layer such as an implanted region. For example, characteristics of an implanted region may include implant dose and implantation depth profile. Sheet resistance may also be used to determine characteristics of a conductive layer such as thickness.

Figure 5A:
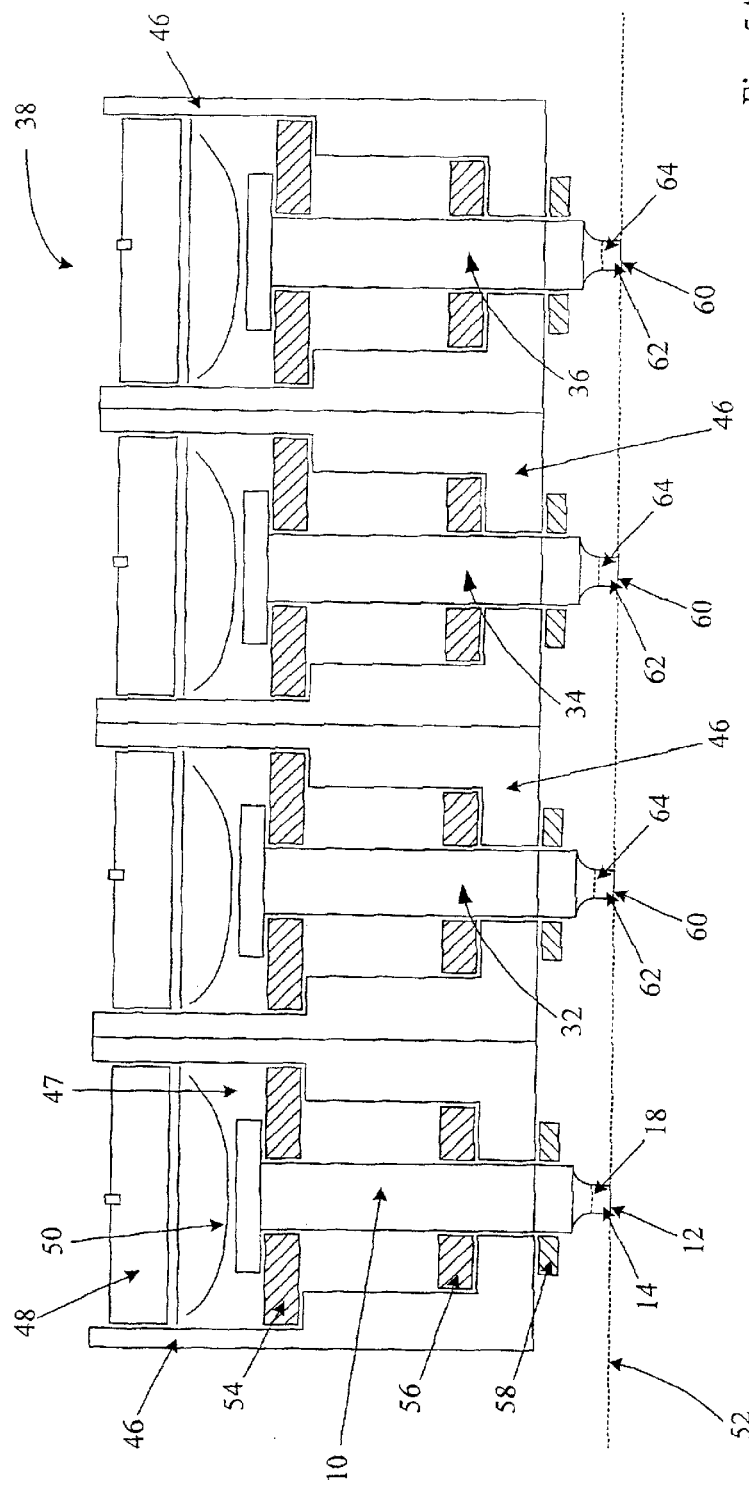
FIG. 5A depicts a schematic cross-sectional side view of a four point probe having a pin and three additional pins.

FIG. 5A illustrates a schematic cross-sectional side view of an embodiment of probe 38. As shown in FIG. 5A, pin 10 and additional pins 32, 34, and 36 may be disposed within probe 38 in a linear array. In an alternative embodiment, pin 10 and additional pins 32, 34, and 36 may be disposed within probe 38 in a two dimensional array. For example, probe 38 may include four barrels 46. The four barrels may be coupled in a linear array or a two dimensional array. Therefore, regardless of the arrangement of barrels 46 within probe 38, pin 10 and additional pins 32, 34, and 36 may be disposed within barrels 46 as illustrated in FIG. 5A. For example, each pin may be disposed within an opening 47 formed in each barrel 46.

In an embodiment, slotted disc 48 may also be disposed within opening 47. Slotted disc 48 may be configured to be securely coupled within opening 47 and may be configured to maintain and/or alter a pressure on a pin disposed within opening 47. For example, slotted disc 48 and barrel 46 may be threaded such that a position of the slotted disc in the barrel may be altered by rotating the slotted disc. In addition, slotted disc 48 may be coupled to a pressure adjustment screw (not shown) disposed within barrel 46. As such, a position of each pin with respect to plane 52 may be varied by altering a position of a pressure adjustment screw. In this manner, a position of each pin with respect to plane 52 may be independently altered. For example, a position of each pressure adjustment screw within each of the barrels may be altered such that a contact surface of each pin may be substantially coplanar with plane 52. In addition, a position of a pressure adjustment screw within each of the barrels may be altered such that contact surfaces of pin 10 and additional pins 32, 34, and 26 may be substantially coplanar.

Figure 5B:
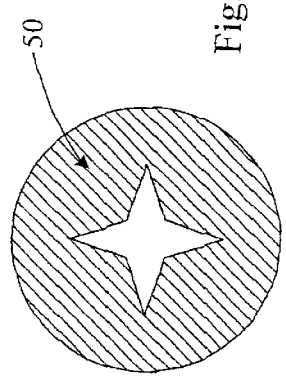
FIG. 5B depicts a schematic top view of a spring which may be disposed within a probe.

In an additional embodiment, spring 50 may be disposed within opening 47 between slotted disc 48 and a pin. FIG. 5B illustrates a schematic top view of an embodiment of spring 50 which may be disposed within opening 47. As shown in FIG. 5B, spring 50 may be configured as a spring washer. An appropriate spring, however, may be depend upon characteristics of a probe, characteristics of a pin, and a conductive layer that may be measured with the probe. Spring 50 may be configured to maintain and/or alter a position of a pin with respect to plane 52. For example, spring 50 may be configured to apply a downward force to a pin. The downward force may be less than a force which may be required for a pin to substantially damage a conductive layer. In this manner, spring 50 may be configured such that a contact surface of each pin within probe 38 may contact an upper surface of a conductive layer during measurement without substantially damaging the conductive layer. Damaging a conductive layer may include, but may not be limited to, penetrating a conductive layer and/or scratching an upper surface of a conductive layer. For example, an upper surface of a conductive layer may be substantially non-planar. Therefore, spring 50 may be configured to alter a position of a pin such that the pin may not substantially damage elevationally raised portions of the conductive layer during measurement. In an additional example, plane 52 may not be substantially parallel to an upper surface of a conductive layer. For example, a lower surface of probe 38 may not be aligned substantially parallel to an upper surface of a conductive layer. As such, spring 50 may be configured to alter a position of a pin such that each pin may contact an upper surface of a conductive layer but may not damage the conductive layer during measurement.

Probe 38 may also be configured such that a pin may contact a conductive layer upon which a dielectric layer may be formed. For example, spring 50 may also be configured to apply a downward force to a pin which may be greater than a force required for a pin to penetrate a dielectric layer. The dielectric layer may include any dielectric known in the art such a native oxide formed upon a silicon substrate. In this manner, spring 50 may be configured such that a contact surface of each pin within probe 38 may penetrate the dielectric layer such that the contact surfaces may contact an upper surface of a conductive layer without substantially damaging the conductive layer.

In a further embodiment, bearing guides 54 and 56 may also be disposed within opening 47. Bearing guides 54 and 56 may be configured to maintain a lateral position of a pin within opening 47. In addition, bearing guides 54 and 56 may be further configured to maintain a position of a pin within opening 47 with respect to plane 52. For example, as shown in FIG. 5A, bearing guide 54 may be configured to limit a length of a pin extending from barrel 46. In an additional embodiment, deflection ring 58 may be coupled to an external surface of barrel 46. For example, deflection ring 58 may be coupled to barrel 46 such that the deflection ring may surround a portion of a pin extending from the barrel. In this manner, deflection ring 58 may be configured to maintain and/or alter a lateral position of each pin extending from barrel 46. Deflection ring 58 may include, for example, nylon or another suitable material.

In each of the embodiments illustrated in FIGS. 3A, 3B, 4A, 4B and 5A, pin 10 may be configured as described in above embodiments. In addition, in each the embodiments illustrated in FIGS. 3A, 3B, 4A, 4B and 5A, additional pins 32, 34, and 36 may be configured as described in above embodiments. For example, as shown in FIG. 5A, each contact surface 60 of additional pins 32, 34, and 36 may be substantially planar. In addition, contact surfaces 60 of additional pins 32, 34, and 36 may be substantially coplanar with contact surface 12 of pin 10. For example, contact surfaces 60 of additional pins 32, 34, and 36 and contact surface 12 of pin 10 may be substantially coplanar with plane 52. Each additional pin may also include first portion 62 extending from contact surface 60 of each pin. Furthermore, each first portion 62 of additional pins 32, 34, and 36 may have a cross-sectional area 64 which may be substantially parallel to contact surface 60 of each pin. Cross-sectional area 64 of each first portion 62 of additional pins 32, 34, and 36 may also be substantially equal to cross-sectional area 18 of first portion 14 of pin 10.

In an embodiment, a probe may include only one pin. For example, FIG. 6A illustrates a schematic cross-sectional view of an embodiment of pin 66. Pin 66 may include conductive portion 68 extending from a contact end of pin 66. Conductive portion 68 may include any of the conductive materials as described in above embodiments such as a metal, tungsten carbide, a tungsten carbide tip welded to a stainless steel pin, stainless steel, titanium carbide, and osmium. Conductive portion 68 may also include four conductors 70. The four conductors of pin 66 may be disposed in a two dimensional array. Conductors 70 may be configured as described in above embodiments. For example, each of the four conductors may include contact surface 72. Contact surface 72 of each conductor may be substantially planar. A contact surface of each conductor may also be coplanar with contact surfaces of each of the other conductors. For example, as shown in FIG. 6A, contact surface 72 of each of the four conductors may be substantially coplanar with plane 74. In addition, first portion 76 of each of the four conductors extending laterally from contact surface 72 may have cross-sectional area 77 which may be substantially parallel with plane 74. Cross-sectional area 77 of each conductor may also be substantially equal to a surface area of contact surface 72 across length 78 of first portion 76.

Each contact surface 72 of the four conductors may include outer edge 80. Outer edge 80 may surround substantially an entirety of contact surface 72 thereby defining a surface area of the contact surface. For example, FIGS. 8A, 8B, and 8C illustrate schematic bottom views of embodiments of pin 66 in which outer edge 80 defines a surface area of each contact surface 72 of the four conductors. As shown in FIG. 8A, outer edge 80 of each contact surface 72 may have a shape of approximately one fourth of a circle. Alternatively, as shown in FIG. 8B, outer edge 80 of each contact surface 72 may have a substantially circular shape. In addition, as shown in FIG. 8C, outer edge 80 of contact surface 72 may have a substantially square shape.

Each of the four conductors may be coupled to insulating portion 82 of pin 66. Insulating portion 82 may be coupled to conductive portion 68 by an adhesive material or by any suitable mechanical devices. Each of the four conductors may also be coupled to insulting portion 82 such that the four conductors may be spaced apart by less than approximately 0.2 mm. The space between each of the four conductors may be larger or smaller, however, depending on, for example, a spreading resistance of the four conductors. Second portion 82 may include an insulating support rod. For example, second portion 82 may include an insulating material such as a polyimide, which may be commonly referred to as Vespel™, polytetrafluoroethylene ("PTFE"), poly(vinyl chloride) ("PVC"), or a thermoplastic acetal resin, which may be commonly referred to as Delrin™.

Second portion 82 may also include holes configured to surround wiring 84. For example, FIG. 6B illustrates a schematic cross-sectional view of an embodiment of second portion 82 in plane 86 shown in FIG. 6A. As shown in FIG. 6B, holes 88 may be formed through second portion 82 in a direction perpendicular to plane 86. In this manner, wiring 84 for each of the four conductors may be disposed within second portion 82. Wiring 84 may be used to connect conductive portion 68 to a system in which the probe may be disposed. Additionally, wiring 84 may be configured to connect a system in which the probe is disposed to each of four conductors 70. In this manner, wiring 84 for each of the four conductors may be insulated from wiring for each of the other four conductors.

FIGS. 6C and 6D illustrate schematic cross-sectional views of alternative embodiments of pin 66. As shown in FIGS. 6C and 6D, pin 66 may include four conductors 90. Conductors 90 may include any of the conductive materials as described in above embodiments. Conductors 90 of pin 66 may be disposed in a two dimensional array. Conductors 90 may also be configured as described in above embodiments. For example, each of the four conductors may include contact surface 72 as described in above embodiments. Contact surface 72 of each conductor may be substantially planar. Contact surface 72 of each conductor may also be coplanar with contact surfaces of each of the other conductors. For example, as shown in FIGS. 6C and 6D, a contact surface of each of the four conductors may be substantially coplanar with plane 74.

In addition, a first portion of each of the four conductors extending laterally from contact surface 72 may have a cross-sectional area which may be substantially parallel with plane 74. A cross-sectional area of each conductor may also be substantially equal to a surface area of contact surface 72 across a length of the first portion. Each contact surface 72 of the four conductors may include outer edge 80. Outer edge 80 may surround substantially an entirety of contact surface 72 thereby defining a surface area of the contact surface. As shown in FIGS. 8A, 8B, and 8C, outer edge 80 of each contact surface 72 may have a shape of approximately one fourth of a circle, a substantially circular shape, or a substantially square shape, respectively.

As shown in FIG. 6C, conductors 90 may be coupled by adhesive insulating material 92. For example, adhesive insulating material 92 may include an epoxy resin or a silicone material. In addition, adhesive insulating material 92 may include a glass frit material that may be used to define a spacing between conductors 90. In this manner, adhesive insulating material 92 may have a thickness that may define a space between conductors 90. For example, adhesive insulating material 92 may have a thickness of less than approximately 0.2 mm. A space between conductors 90, however, may be larger or smaller depending on a spreading resistance of the four conductors. Subsequent to coupling the four conductors with adhesive insulating material 92, the adhesive insulating material may be removed from between conductors 90 proximate contact surface 72. For example, adhesive insulating material 92 may be etched with a suitable chemical such as hydrofluoric acid. Therefore, adhesive insulating material 92 may be spaced from contact surface 72. As such, adhesive insulating material 92 may not contact a conductive layer during measurement. In addition, adhesive insulating material 92 may also not be abraded during measurement and/or conditioning. In this manner, contamination of a conductive layer due to adhesive insulating material 92 may be reduced.

In an alternative embodiment, as shown in FIG. 6D, conductors 90 may be coupled to insulating spacer 94. Insulating spacer 94 may include an insulating material such as a polyimide, which may be commonly referred to as Vespel™, polytetrafluoroethylene ("PTFE"), poly(vinyl chloride) ("PVC"), and a thermoplastic acetal resin, which may be commonly referred to as Delrin™. Conductors 90 may be securely coupled to insulating spacer 94 with an adhesive material such as an epoxy resin. FIG. 7A illustrates a schematic side view of an embodiment of insulating spacer 94. As shown in FIG. 7A, insulating spacer 94 may include slot 96. Slot 96 may be configured such that two insulating spacers 94 may be coupled in a two dimensional arrangement. For example, FIG. 7B illustrates a schematic bottom view of an embodiment of two insulating spacers 94 disposed in a two-dimensional arrangement. Insulating spacers may also be coupled in such an arrangement with an adhesive material. Insulating spacer 94 may have a thickness which may define a space between conductors 90. For example, insulating spacer 94 may have a thickness of less than approximately 0.2 mm. A space between conductors 90, however, may be larger or smaller depending on a spreading resistance of the four conductors. Conductors 90 may also be coupled to insulating spacer 94 such that insulating spacer 94 may be spaced from contact surface 72. As such, insulating spacer 94 may not contact a conductive layer during measurement. In addition, insulating spacer 94 may also not be abraded during measurement and/or conditioning. Therefore, contamination of a conductive layer due to insulating spacer 94 may be reduced.

In the embodiments illustrated in FIGS. 6A, 6C, and 6D, each conductor of pin 66 may have a lateral dimension of approximately 0.1 mm to approximately 1.0 mm. In addition, a space between each conductor of pin 66 may be approximately 0.1 mm to approximately 0.2 mm. Consequently, pin 66 may have an overall lateral dimension of approximately 0.3 mm to approximately 2.2 mm. In this manner, pin 66 may reduce the edge exclusion of a probe in which the pin may be disposed. Edge exclusion may be defined as a width of a conductive layer extending from an outer edge of a semiconductor substrate which may not be measured due to a lateral dimension of a probe. For example, a probe may be disposed above a conductive layer to be measured such that a lateral dimension of the probe may not extend beyond an outer lateral edge of the conductive layer. As such, a measurement of the conductive layer may be taken at a center of the probe. A center of a probe may be defined at approximately one and one half a lateral dimension of a pin extending inward from an outer lateral edge of the probe. In this manner, edge exclusion of a probe may be approximately one and one half a lateral dimension of a pin. As such, a probe which includes pin 66 may be configured to measure a property of a conductive layer within less than approximately 3 mm from an outer edge of a semiconductor substrate. For example, the probe may be configured to measure a property of a conductive layer within less than approximately 1 mm from an outer edge of a semiconductor substrate. In this manner, a probe which includes pin 66 may have an edge exclusion of less than approximately 0.5 mm.

In addition, pin 66 may have a pin spacing which may be substantially constant over a lifetime of the pin or a lifetime of a probe. For example, as described in the above embodiments, a conductive portion of pin 66 may be securely coupled to an insulating portion of the pin. Therefore, a spacing between four conductors of the conductive portion may be constant after the conductive portion is coupled to the insulating portion. In addition, a spacing between conductors of pin 66 may be defined by a thickness of an adhesive insulating material or insulating spacers. As such, a spacing between conductors of pin 66 may be substantially constant over time. Furthermore, a probe configured to measure a property of a conductive layer using a four point probe technique may include only one such pin. Typically, such probes may include four separate pins individually mounted within the probe. Pin 66, however, may be disposed within a probe as described in above embodiments. Therefore, a probe which includes pin 66 may have substantially fewer mechanical components than conventional probes. In addition, a manufacturing process which may be used to form a probe which includes pin 66 may be substantially less complicated than manufacturing processes which may be used to produce conventional probes. In this manner, a probe which includes pin 66 may have a significantly lower overall cost in comparison to conventional probes. In addition, using pin 66 in such a probe may significantly simplify processes and reduce costs associated with maintaining the probe. For example, such a probe may substantially simplify processes and reduce costs associated with aligning, conditioning, and qualifying the probe.

FIG. 9 illustrates an embodiment of a method for measuring a property of a conductive layer. As shown in step 98, the method may include contacting a conductive layer with a pin. For example, contacting a conductive layer with a pin may include contacting an upper surface of a conductive layer. In addition, contacting a conductive layer may include penetrating a layer such as a dielectric layer formed upon the conductive layer. The pin may be configured as described in any of the above embodiments. For example, the pin may include a contact surface and a first portion extending from the contact surface. The contact surface may be substantially planar. In this manner, contacting the conductive layer may include contacting the conductive layer with substantially an entire surface area of the contact surface. As such, contacting the conductive layer may include contacting an upper surface of the conductive layer with substantially an entire surface area of the contact surface.

In addition, the first portion may include a cross-sectional area which may be substantially parallel to the contact surface. The cross-sectional area may be substantially equal to a surface area of the contact surface across a length of the first portion. The first portion may also extend from the contact surface along an axis substantially perpendicular to the contact surface. In this manner, contacting the conductive layer may include contacting the conductive layer such that the first portion of the pin may be substantially perpendicular to an upper surface of the conductive layer. The pin may be further configured as described in any of the above embodiments. For example, the pin may be disposed within a probe. In an embodiment, the probe may be configured according to any of the embodiments described herein. As such, the method may also include contacting the conductive layer with the pin and the three additional pins. In addition, the pin and the three additional pins may be substantially coplanar during measurement of the property of the conductive layer.

The method may also include measuring the property of the conductive layer with the probe while the pin is in contact with the conductive layer as shown in step 100. In an embodiment, measuring the property of the conductive layer may include measuring the property of the conductive layer within less than approximately 3 mm from an outer edge of a semiconductor substrate. For example, the method may include measuring the property of the conductive layer within less than approximately 1 mm from an outer edge of a semiconductor substrate. A property of a conductive layer may include any of the properties described in above embodiments. In addition, the conductive layer may include any of the conductive layers described above such as an implanted region of a semiconductor substrate. The measured property may include a sheet resistance of the conductor layer. The method may further include determining a characteristic of the conductive layer using the measured sheet resistance. For example, characteristics of a conductive layer such as an implanted region may include implant dose and implantation depth profile. The measured sheet resistance may also be used to determine characteristics of a thickness of a conductive layer such as a metallization layer.

FIG. 10 illustrates an embodiment of a method for fabricating a semiconductor device. As shown in step 102, the method may include forming a conductive portion of the semiconductor device upon a semiconductor substrate. For example, the conductive portion may include an implanted region of a semiconductor substrate such as a lightly doped drain junction, a source/drain junction, and an ultra shallow junction. The conductive portion may also include a conductive structure formed upon a semiconductor substrate such as a gate electrode and a local interconnect. In addition, the conductive portion may include a conductive layer such as a metallization layer. In this manner, forming a conductive portion of a semiconductor device may include, for example, ion implantation, rapid thermal processing, deposition, plating chemical mechanical polishing, lithography, and etch.

As shown in step 104, the method may further include contacting the conductive portion with a pin. The pin may be configured as described in any of the above embodiments. Furthermore, the method may include measuring the property of the conductive portion with the probe while the pin is in contact with the conductive portion as shown in step 106. For example, the measured property may include sheet resistance of the conductive portion. The method may further include determining a characteristic of the conductive portion using the measured sheet resistance. For example, characteristics of an implanted region may include implant dose and implantation depth profile. Sheet resistance may also be used to determine characteristics of a thickness of a conductive portion such as a metallization layer.

FIG. 11 illustrates an embodiment of system 108 configured to measure a property of a conductive layer. The property of the conductive layer may include sheet resistance and/or thickness of the conductive layer. A conductive layer may include any of the conductive layers as described herein. The conductive layer may also be formed on a semiconductor substrate or a glass substrate having a diameter of greater than approximately 200 mm. For example, the conductive layer may be formed on a substrate having a diameter of approximately 300 mm.

Figure 12:
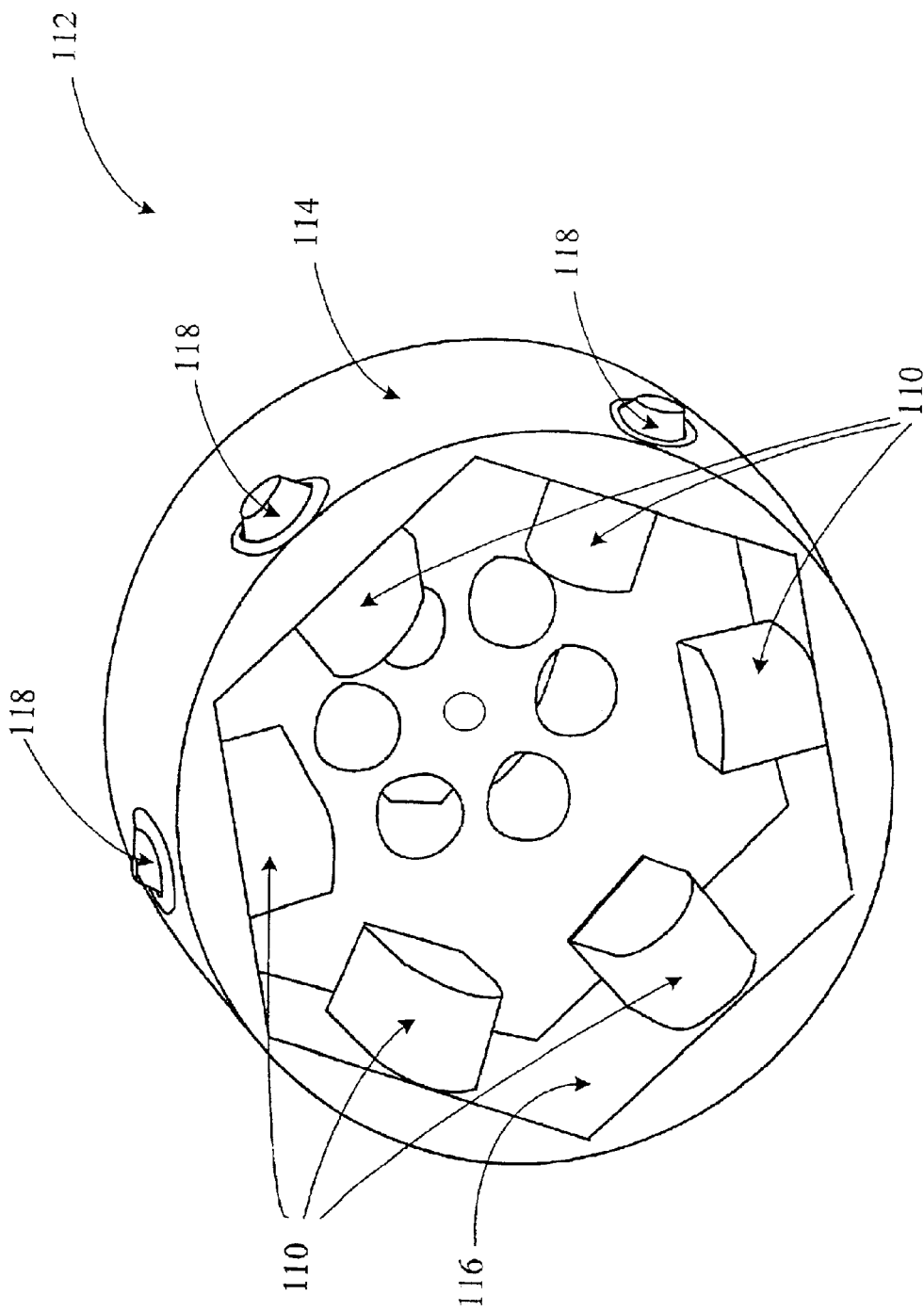
FIG. 12 depicts an isometric view of a mounting device configured to rotate such that a contact surface of one probe may be spaced above an upper surface of a conductive layer.

In an embodiment, system 108 may include at least two probes 110. System 108 may also include mounting device 112. Probes 110 may be coupled to mounting device 112. For example, probes 110 may be coupled to mounting device 112 by a clamping mechanism or another suitable mechanical device. FIG. 12 illustrates an embodiment of mounting device 112 in which six probes may be coupled to mounting device 112. As shown in FIG. 12, probes 110 may be coupled to internal surface 116 of mounting device 112. Probes 110 may also extend through mounting device 112 such that portion 118 of probes 110 may extend laterally from mounting device 112. For example, as shown in FIGS. 11 and 12, mounting device 112 may include nonlinear external surface 114. In this manner, probes 110 may be coupled to mounting device 112 such that a portion of probes 110 may extend from nonlinear external surface 114. Probes 110 may also be spaced laterally across nonlinear external surface 114. For example, probes 110 may be spaced laterally across nonlinear external surface 114 at substantially uniform intervals. In this manner, a lateral dimension between a first set of laterally adjacent probes and a lateral dimension between a second set of laterally adjacent probes may be substantially equal. In addition, mounting device 112 may be configured such that only one of probes 110 may contact a conductive layer during measurement. For example, a lateral dimension between laterally adjacent probes may be selected such that only one probe may contact a conductive layer at a time. A lateral dimension between laterally adjacent probes may vary depending on, for example, a curvature of an external surface of a mounting device and a diameter of the mounting device.

The mounting device configured as described herein enables multiple probes to be arranged within system 108. Probes 110 may be configured such that each probe may be appropriate for a different type for measurement. For example, a property of a conductive layer, which may be measured with a probe, may depend on characteristics of the probe such as a lateral dimension of the contact surface of a pin disposed within the probe. Typically, a four-point probe system may be required to perform approximately two to approximately four different types of measurements. Each measurement may require a different type of probe. Therefore, mounting device 112 may be configured such that each different type of probe may be coupled to the mounting device. For example, mounting device 112 may be configured such that all currently available types of probes may be coupled to the mounting device. In addition, mounting device 112 may be configured such that each different type of probe may be disposed within the mounting device without regard to position.

In an embodiment of system 108, therefore, each different type of measurements may be performed without manually replacing the probes. In addition, an average lifetime of a probe may be approximately one to approximately two years. As such, probe installation in a system including mounting device 112 may need to be performed only once within approximately two years. In contrast, probe installation may be performed several times in a single day for systems including only one probe such that different types of measurements may be performed. Therefore, system 108 may be configured for substantially automated operation thereby significantly reducing the amount of manual operation of such systems. In this manner, process yield may increase because substantially minimizing manual operation of such systems may substantially eliminate contamination of the system and contamination of semiconductor substrates processed in the system. For example, the system may be substantially enclosed in a mini-environment which may be defined by an enclosure surrounding the system. The mini-environment may be configured to maintain predetermined temperature and humidity conditions proximate the system and to prevent contamination of the system. In order to perform manual operation of such systems, however, an operator may access the system through a door thereby exposing the mini-environment to a clean room environment. Minimizing manual operation of such systems may substantially eliminate opening the door and may substantially eliminate any adverse effects of exposing the mini-environment to the clean room environment. Throughput of such a system may also increase substantially due to the reduced amount of manual operation of such systems. In addition, maintenance processes such as removing and replacing a probe and conditioning and qualification may be substantially eliminated or automated. Automated maintenance processes may also be substantially faster than manual maintenance processes. As such, overall cost of fabricating a semiconductor device may decrease, and manufacturing capacity may increase.

Each probe 110 may be configured to measure a property of a conductive layer. The probes may be further configured as described in any of the above embodiments. For example, probes 110 may include four pins. In addition, each probe may also be configured to pass a current between a first and a second of the four pins. Each probe may also be configured to measure a voltage drop across a third and a fourth of the four pins. Each of the four pins may include a contact surface. The contact surface of each pin may be configured to contact the conductive layer during measurement. In addition, the contact surface of each pin may substantially planar. Each pin may also include a first portion extending from the contact surface. The first portion of each pin may have a cross-sectional area which may be substantially parallel to the contact surface. The cross-sectional area of each first portion across substantially an entire length of the first portion may be substantially equal to a surface area of the contact surface of each pin. Alternatively, probes 110 may include only one pin as described in above embodiments. The pin may include a conductive portion which may include four conductors. Each of the four conductors may include a contact surface. The contact surface may be configured to contact the conductive layer during measurement as described above.

System 108 may also be configured to have a reduced edge exclusion in comparison to currently available systems. For example, each pin of probe 110 may have a lateral dimension of approximately 0.1 mm to approximately 1.0 mm. A space between each pin or between each conductor of a probe may also be approximately 0.1 mm to approximately 0.2 mm. Therefore, probe 110 may have an overall lateral dimension of approximately 0.3 mm to approximately 2.2 mm. In this manner, probe 110 may be configured to reduce the edge exclusion of system 108. In addition, a mounting device 112 may be configured to position a probe substantially closer to an outer edge of a semiconductor substrate in comparison to conventional probe heads. For example, mounting device 112 may also be configured to accurately position a probe within less than approximately 1 mm from an outer edge of a semiconductor substrate. In this manner, mounting device 112 may be configured to reduce the edge exclusion of system 108. System 108 may also be configured to optically center a semiconductor substrate and to detect a flat or a notch of a semiconductor substrate to substantially eliminate repositioning errors and to enhance probe placement precision and accuracy. For example, system 108 may include a camera alignment system (not shown) or another suitable optical device. Furthermore, system 108 may be configured to determine a property of a conductive layer with improved edge modeling to correct for current-crowding, which may occur proximate an outer edge of a conductive layer such as at an outer edge of a semiconductor substrate. Therefore, system 108 may be configured to measure a property of a conductive layer within less than approximately 3 mm from an outer edge of a semiconductor substrate, and more preferably within less than approximately 1 mm from an outer edge of a semiconductor substrate. In this manner, edge exclusion of system 108 may be reduced to approximately 0.5 mm.

Figure 13:
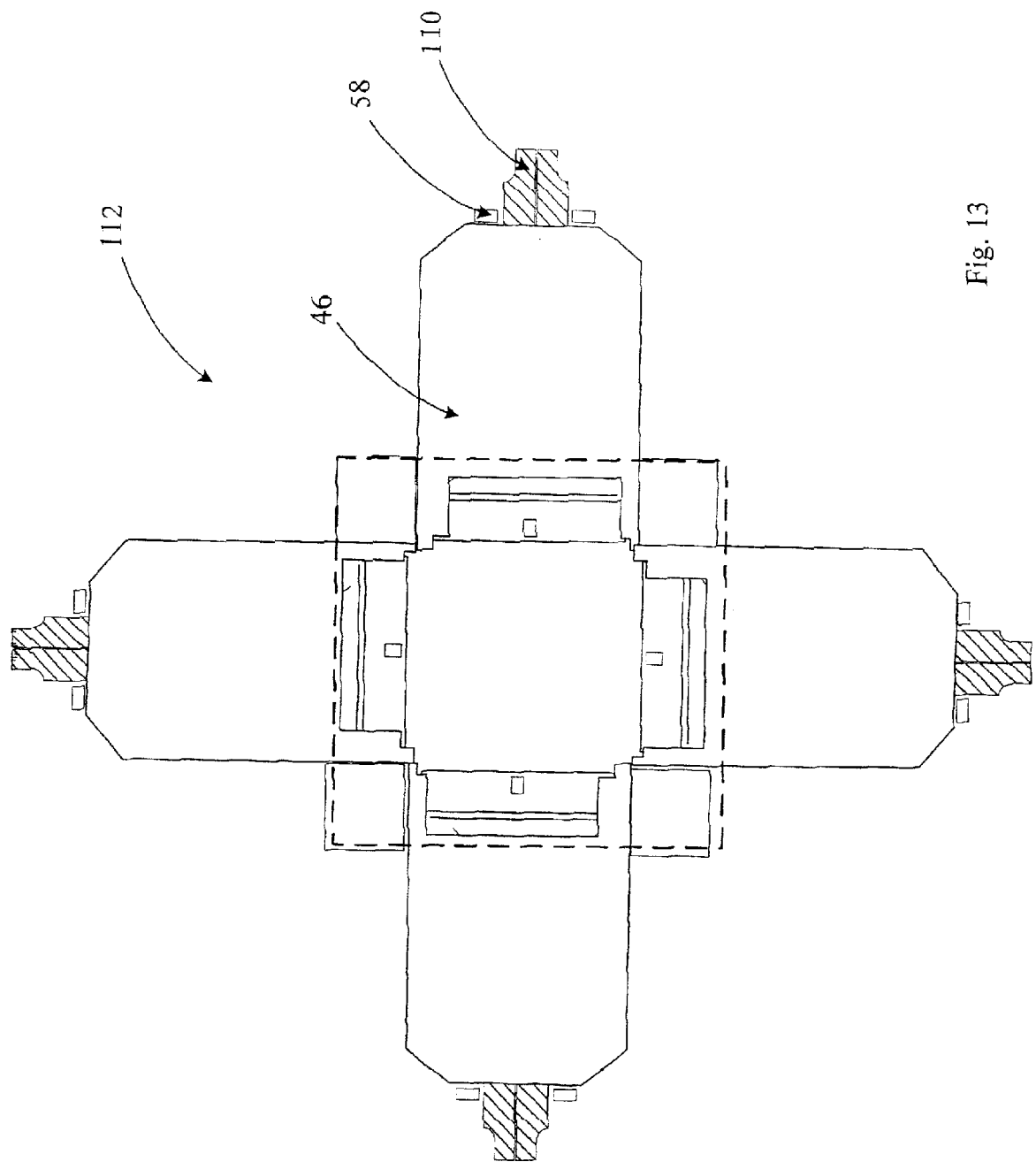
FIG. 13 depicts a schematic side view of a mounting device configured to rotate such that a contact surface of one probe may be spaced above an upper surface of a conductive layer.
Figure 14:
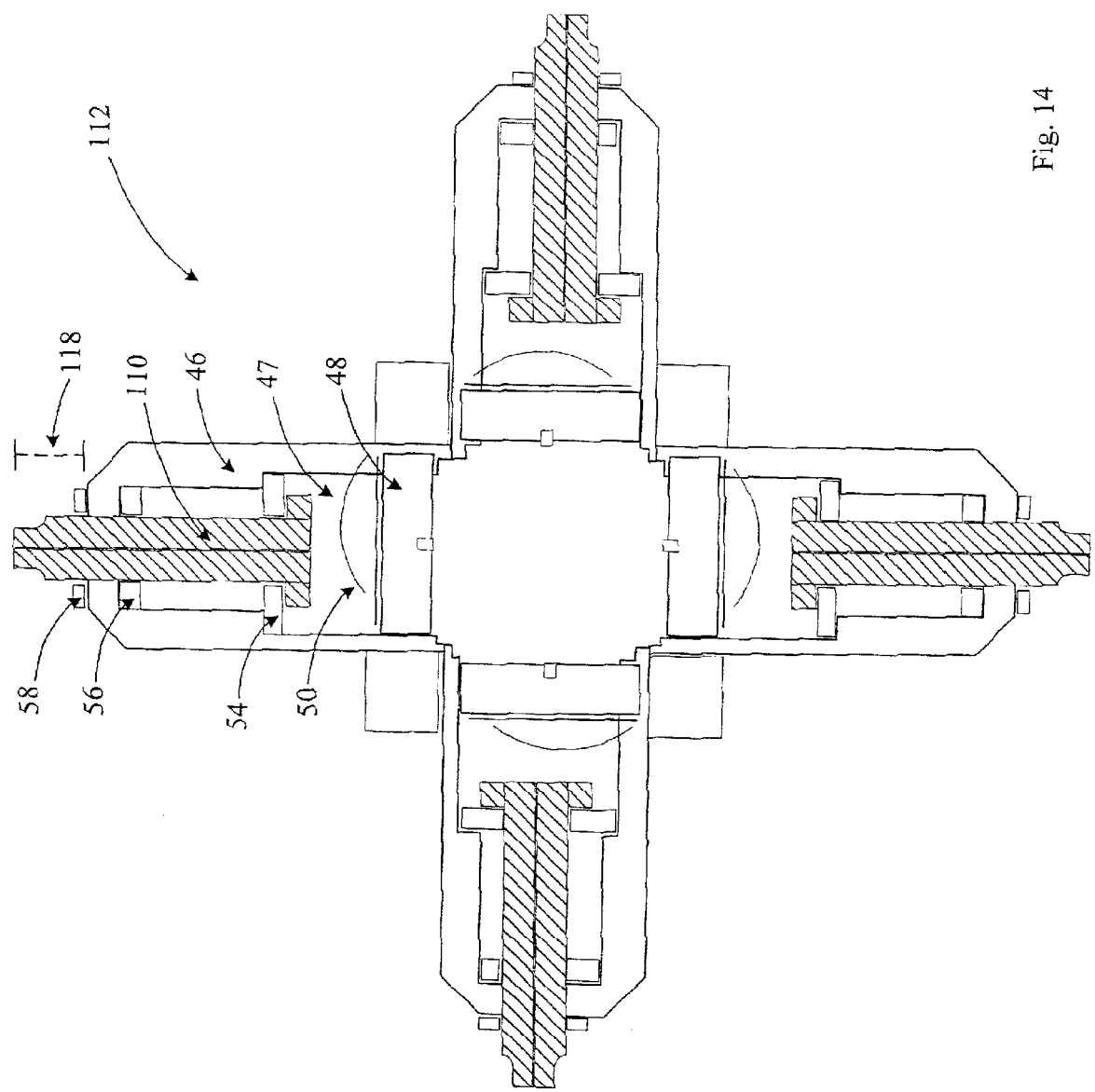
FIG. 14 depicts a schematic cross-sectional side view of a mounting device configured to rotate such that a contact surface of one probe may be spaced above an upper surface of a conductive layer.

FIGS. 13 and 14 illustrate an alternative embodiment of mounting device 112. As shown in FIG. 13, each probe 110 may be disposed within a barrel 46. In an embodiment, probe 110 may include only one pin which may be configured as described in above embodiments. In an additional embodiment, however, probe 110 may also be configured as described in any of the above embodiments. For example, probe 110 may include four pins which may be disposed in a linear array or a two dimensional array. A plurality of barrels 46 may be coupled to form mounting device 112. Each barrel 46 may be configured as described in above embodiments. For example, as shown in FIG. 14, each probe 110 may be disposed within an opening 47 formed in each barrel 46. In addition, slotted disc 48 may also be disposed within opening 47. Slotted disc 48 may be configured as described in above embodiments. For example, slotted disc 48 may be coupled to a pressure adjustment screw (not shown) which may be disposed within barrel 46. As such, portion 118 of each probe 110 extending laterally from an external surface of mounting device 112 may be varied by altering a position of a pressure adjustment screw. Spring 50 may also be disposed within opening 47 between slotted disc 48 and probe 110. Spring 50 may be configured as described in above embodiments. In a further embodiment, bearing guides 54 and 56 may be disposed within opening 47. In addition, deflection ring 58 may be coupled to an external surface of barrel 46. Bearing guides 54 and 56 and deflection ring 58 may be configured as described in above embodiments.

Mounting device 112 may be further configured to rotate such that a contact surface of one of probes 110 may be spaced above an upper surface of a conductive layer. For example, as shown in FIG. 11, mounting device 112 may be coupled to mechanical device 120. Mechanical device 120 may include any suitable mechanical device such as a motorized translation system or a direct drive motor configured to impart relative motion to mounting device 112. Mechanical device 120 may be further configured to move mounting device 112 rotatably around axis 122 which may be substantially parallel to an upper surface of stage 124. Stage 124 configured to support a semiconductor substrate (not shown) or another appropriate specimen. In addition, a conductive layer as described in above embodiments may be formed upon or within a semiconductor substrate. In this manner, mechanical device 120 may be configured to move mounting device 112 rotatably around axis 122 which may be substantially parallel to an upper surface of a conductive layer.

Mounting device 112 may also be configured such that a contact surface of a probe spaced above an upper surface of the conductive layer may be substantially parallel to an upper surface of the conductive layer. As such, mounting device 112 may be configured to position one of probes 110 above an upper surface of a conductive layer. In an additional embodiment, mounting device 112 may be further configured to move linearly to alter a distance between one of the probes and a conductive layer. As such, the mounting device may be configured to contact an upper surface of a conductive layer with a probe positioned above the upper surface of the conductive layer. For example, mounting device 112 may be coupled to motorized device 126. Motorized device 126 may be configured to move the mounting device linearly. Motorized device 120 may include any suitable mechanical device such as a motorized translation system or a vertical slide mechanism configured to impart relative motion to mounting device 112. Motorized device 120 may also be configured to impart relative motion to mounting device 112 such that measurements may be performed at different locations upon a semiconductor substrate. In this manner, system 108 may be configured to generate a map representative of measured properties of the conductive layer at different locations across the semiconductor substrate. Alternatively, mechanical device 120 may be configured to move the mounting device rotatably and linearly. In this manner, system 108 may include mechanical device 120 and motorized device 126, or system 108 may only include mechanical device 120.

In an embodiment, stage 124 may include a vacuum chuck or an electrostatic chuck. In this manner, a semiconductor substrate may be held securely in place upon stage 124. In addition, stage 124 may be a motorized translation stage, a robotic wafer handler, or any other suitable mechanical device. As such, stage 124 may be configured to impart relative motion to a semiconductor substrate. For example, stage 124 may be configured to move a semiconductor substrate relative to mounting device 112. In an embodiment, stage 124 may be configured to move a semiconductor substrate laterally with respect to mounting device. Stage 124 may also be configured to impart relative motion to mounting device 112 such that measurements may be performed at different locations upon a semiconductor substrate. In this manner, system 108 may be configured to generate a map representative of measured properties of the conductive layer at different locations across the semiconductor substrate. Stage 124 may be further configured to move a semiconductor substrate such that a distance between the semiconductor substrate and mounting device 112 may be altered. In addition, stage 124 may be configured to move rotatably such that a semiconductor substrate may be oriented with respect to mounting device 112 in a plurality of directions. As such, the stage may also be used to correct an orientation of a semiconductor substrate with respect to the mounting device such that a semiconductor substrate may be aligned with respect to a probe during measurement.

System 108 may also be configured to transfer a semiconductor substrate into the system through a standard mechanical interface ("SMIF") or through a front opening unified pod ("FOUP"). For example, system 108 may be configured such that a SMIF or a FOUP may be coupled to the system. In an embodiment, system 108 may be further coupled to a front interface mechanical standard ("FIMS") drop. A FIMS drop may be a mechanical device configured to lower a FOUP from an overhead transportation system to a semiconductor fabrication process tool or a stand-alone inspection or metrology tool. In addition, the system may include a robotic wafer handler or another suitable mechanical device which may be configured to transfer a semiconductor substrate from a SMIF or a FOUP to the system. As such, the system may be configured to transfer a semiconductor substrate from a SMIF or a FOUP onto stage 124. In this manner, system 108 may be configured to operate within a substantially completely automated semiconductor fabrication facility. Such a semiconductor fabrication facility may be used to manufacture semiconductor devices upon semiconductor substrates having a diameter of approximately 300 mm. Therefore, system 108 may be particularly suitable for measuring a property of a conductive layer formed on a semiconductor substrate having a diameter of approximately 300 mm.

FIGS. 15 and 16 illustrate alternative embodiments of mounting device 112. For example, mounting device 112 may include planar external surface 128. As shown in FIG. 15, mounting device 112 may be disposed above stage 124. In addition, a semiconductor substrate may be disposed upon stage 124 as described in above embodiments. In this manner, mounting device 112 may be disposed above a conductive layer such that planar external surface 128 may be substantially parallel to and spaced above an upper surface of a conductive layer. In addition, probes 110 may be coupled to mounting device 112 such that portion 118 of each probe may extend from planar external surface 128. Probes 110 may be further coupled to mounting device 112 as described in above embodiments. In this manner, mounting device 112 may be configured such that a contact surface of each probe coupled to the mounting device may be spaced above an upper surface of a conductive layer. Mounting device 112 may also be configured such that a contact surface of each probe may be substantially parallel to an upper surface of the conductive layer.

In an embodiment, mounting device 112 may also be configured to move rotatably around axis 130 which may be substantially perpendicular to an upper surface of a conductive layer. In this manner, mounting device 112 may be configured to position one of the probes above an area of interest within a conductive layer. Mounting device 112 may also include a solenoid (not shown) coupled to each probe. Each solenoid may be configured to alter a position of a probe such that the probe may contact a conductive layer during measurement. For example, each solenoid may be configured to move a positioned probe toward an upper surface of a conductive layer such that the positioned probe may contact the conductive layer. As shown in FIG. 17, a position of probe 110a may be altered by a solenoid such that probe 110a may be in contact with conductive layer 134. Positions of probes 110b, however, may not be altered by solenoids such that probes 110b may be spaced above the conductive layer 134. In this manner, a property of conductive layer 134 may be measured by probe 110a. In an embodiment, a semiconductor substrate may include a plurality of conductive layers laterally spaced across the semiconductor substrate. For example, a plurality of conductive layers may include implanted regions formed within and spaced across a semiconductor substrate. In this manner, positions of probes 110b may also be altered by solenoids such that probes 110b and probe 110a may each be in contact with one of the plurality of conductive layers. In this manner, multiple measurements may be performed across a semiconductor substrate substantially simultaneously.

In an embodiment, system 108 may also include at least one resistor pack (not shown) coupled to mounting device 112. For example, a resistor pack may be coupled to mounting device 112 in a manner similar to which probes 110 may be coupled to mounting device 112 as described in above embodiments. A resistor pack may include a set of resistors which may be configured to simulate and/or calibrate electronics of the system such as a voltmeter and a current source. System 108 may also include three probes and three resistor packs. Each of the resistor packs may be configured to calibrate electronics of the system. System 108 may also include a probe simulator (not shown) configured to calibrate at least one of the two probes. In an embodiment, system 108 may also include a conditioning plate (not shown). A conditioning plate may include, for example, ceramic, lapped silicon, sapphire, aluminum oxide, roughened sapphire, or an unpolished surface of a semiconductor substrate. A conditioning plate may be configured to move against a surface of at least one of probes 110 such that contaminants may be removed from a surface of the probe.

In an additional embodiment, system 108 may include a controller computer (not shown) coupled to the system. The controller computer may include controller software executable on the controller computer. The controller software may be operable to implement a method for controlling the system. For example, the controller computer may be further coupled to a conditioning plate. Controller software executable on the controller computer may be operable to implement a method for controlling the conditioning plate. In addition, controller software may be further operable to implement a method for qualifying the probes subsequent to conditioning. Therefore, system 108 may be configured to perform substantially automated conditioning and qualification of each probe 110. An automated conditioning and qualification process may be performed in substantially less time than the time typically required to perform conditioning and qualification manually.

Conditioning and qualification may be an iterative process requiring several cycles before a measurement may be performed. Conditioning and qualification may be performed using a number of parameters that may be determined by a user. Such parameters may include, for example, a number of conditioning sites per cycle, a maximum number of a number of conditioning and qualification cycles to be performed, a number of conditioning sites determined from probe qualification results, a probe qualification target value, a number of locations out of four which may have to meet a probe qualification target value, and a number of times to repeat qualification before conditioning. The parameters may be stored in a probe qualification program, commonly referred to as a "recipe," which may be accessed by the controller software. The controller software may, therefore, be operable to perform conditioning and qualification of a probe according to such parameters.

Conditioning and qualification may be performed iteratively until a probe meets qualification standards. Alternatively, conditioning and qualification may be performed iteratively until a number of conditioning and qualification cycles performed may exceed a predetermined maximum number of cycles. For example, a predetermined maximum number of cycles may be determined from input from a user. A predetermined maximum number of cycles may be specified by the user for each probe. The input from the user may also be stored in a probe qualification program which may be accessed by the controller software. In addition, the controller software may also be operable to implement a method for generating a signal such as an audible or visual warning message if the number of cycles performed exceeds the predetermined maximum number of cycles. Furthermore, multiple probes of a single type may be coupled to the mounting device. In this manner, the controller software may be operable to implement at method for conditioning and qualifying each of the multiple probes.

In addition, the controller software may be operable to implement a method for comparing the qualification results of each of the multiple probes. As such, the controller software may be operable to implement a method for determining which of the multiple probes may have the highest qualification results. The probe determined to have the highest qualification results may be selected for measurement of a conductive layer. Furthermore, the controller software may be operable to implement a method for storing the conditioning and qualification parameters and the qualification results. In this manner, a conditioning and qualification history for each of the probes may be generated by the controller software. The controller software may also be operable to implement a method for displaying the stored parameters and results upon receiving a request from a user. In addition, the stored parameters and results may be accessible from a host computer. As such, the stored parameters and results may be accessible from a remote location within a semiconductor fabrication facility.

In an embodiment, the controller software may also be operable to implement a method for optimizing the current applied to a probe before measuring a property of a conductive layer with a system. In this manner, the system may be configured to optimize a predetermined current of a selected program which may be commonly referred to as a "recipe." For example, the method may include applying at least two substantially different currents to at least one of probes 110. The method may also include measuring a voltage drop of the probe subsequent to applying each current. In addition, the method may include determining a minimum standard deviation of the measured voltage drop and an applied current associated with the determined minimum standard deviation.

In an embodiment, the controller computer may also be coupled to mounting device 112. Controller software executable on the controller computer may be operable to implement a method for controlling mounting device 112. In an embodiment, the controller software may also be operable to implement a method for calibrating the system or a probe disposed within the mounting device. For example, the controller software may be operable to implement a method for determining an identity and a position of each resistor pack or probe simulator within mounting device 112. The controller software may be operable to implement a method for determining an identity and a position of each probe 110 within mounting device 112. The controller software may also be operable to implement a method for determining an identity and a position of each resistor pack, probe simulator, and probe within a mounting device upon receiving a query from a user. Furthermore, the controller software may be operable to implement a method for calibrating electronics of the system or a probe within mounting device with a resistor pack or probe simulator, respectively.

In an additional embodiment, the controller software may be operable to implement a method for determining an identity of a probe selected to measure the property of a conductive layer. For example, the method may include receiving input from a user representative of a probe selected to measure the property of a conductive layer. Input from the user may also include a selected program, commonly referred to as a "recipe," which may include instructions for measuring a property of a conductive layer. The selected program may include an identity and/or a type of a probe which may be appropriate for measuring the property of the conductive layer. The selected program may also include instructions for automatically altering a position of mounting device 112 such that a selected probe may be disposed above a conductive layer. The selected program may further include instructions for automatically contacting the conductive layer with the selected probe and measuring a property of the conductive layer.

The method may also include determining a position of the selected probe within the mounting device. For example, an identity and a position of each probe coupled to a mounting device may be included in a database or a look-up table. The database or table may be stored on the controller computer. The controller software may also be operable to access the database or look-up take to determine a position of the selected probe within the mounting device. In addition, the controller software may be operable to implement a method for altering a position of the mounting device such that the selected probe may disposed above the conductive layer. In this manner, automatically disposing a selected probe above a conductive layer may be performed in less than approximately five seconds. The controller software may be further operable to implement a method for altering a position of the mounting device such that the selected probe may contact the conductive layer during measurement. For example, the controller computer may be coupled to a motorized device coupled to the mounting device. In addition, the controller software may be operable to implement a method for controlling the motorized device to move the mounting device such that the selected probe may contact the conductive layer. Prior to measuring a property of a conductive layer, the controller software may be configured to implement a method for determining an identity and/or a type of a probe in contact with the conductive layer. In this manner, the system may be configured to confirm that an appropriate probe may be used to measure a property of the conductive layer. Furthermore, the controller software may be configured to implement a method for storing an identity and/or a type of a probe which may be in contact with the conductive layer. As such, the system may be configured to perform substantially automated selection and exchange of probes.

In an embodiment, a controller computer may include a computer system configured to operate software to control the system according to the above embodiments. The computer system may include a memory medium on which computer programs may be stored for controlling the system and determining a property of a conductive layer. The term "memory medium" is intended to include an installation medium, e.g., a CD-ROM, or floppy disks, a computer system memory such as DRAM, SRAM, EDO RAM, Rambus RAM, etc., or a non-volatile memory such as a magnetic media, e.g., a hard drive, or optical storage. The memory medium may include other types of memory as well, or combinations thereof. In addition, the memory medium may be located in a first computer in which the programs are executed, or may be located in a second different computer that connects to the first computer over a network. In the latter instance, the second computer provides the program instructions to the first computer for execution. Also, the computer system may take various forms, including a personal computer system, mainframe computer system, workstation, network appliance, Internet appliance, personal digital assistant (PDA), television system or other device. In general, the term "computer system" may be broadly defined to encompass any device having a processor which executes instructions from a memory medium.

The memory medium preferably stores a software program for operation and control of a system as described in above embodiments. The software program may be implemented in any of various ways, including procedure-based techniques, componentbased techniques, and/or object-oriented techniques, among others. For example, the software program may be implemented using ActiveX controls, C++ objects, JavaBeans, Microsoft Foundation Classes (MFC), or other technologies or methodologies, as desired. A CPU, such as the host CPU, executing code and data from the memory medium comprises a means for creating and executing the software program according to the methods described above.

Various embodiments further include receiving or storing instructions and/or data implemented in accordance with the foregoing description upon a carrier medium. Suitable carrier media include memory media or storage media such as magnetic or optical media, e.g., disk or CD-ROM, as well as signals such as electrical, electromagnetic, or digital signals, conveyed via a communication medium such as networks and/or a wireless link.

FIG. 18 illustrates an embodiment of a method for measuring a property of a conductive layer. The property may include any of the properties described above such as sheet resistance. In addition, the conductive layer may include any of the conductive layers as described above such as an ultra shallow junction. As shown in step 138, the method may include disposing a probe above a conductive layer. The probe may be configured as described in any of the above embodiments. For example, the probe may be coupled to a mounting device. In addition, the mounting device may include at least two probes as described above. The mounting device may also be further configured as described in above embodiments.

Disposing a probe above a conductive layer may include rotating the mounting device such that a contact surface of one of the probes may be spaced above an upper surface of the conductive layer. For example, disposing the probe above the conductive layer may include rotating the mounting device around an axis which may be substantially parallel to an upper surface of the conductive layer. In addition, disposing a probe above a conductive layer may include rotating the mounting device such that a contact surface of a probe spaced above an upper surface of a conductive layer may be substantially parallel to the upper surface of the conductive layer. As such, disposing a probe above a conductive layer may include positioning one of the probes above an upper surface of the conductive layer. Alternatively, disposing a probe above a conductive layer may include rotating the mounting device around an axis which may be substantially perpendicular to an upper surface of the conductive layer. In this manner, disposing a probe above a conductive layer may include positioning one of the probes above an area of interest within a conductive layer.

In an additional embodiment, the method may include determining an identity and a position of each probe coupled to the mounting device with controller software executable on a controller computer. The controller computer may be coupled to the mounting device and may be configured as described in above embodiments. The method may also include determining an identity of a probe selected to measure the property of a conductive layer and a position of the selected probe within the mounting device with controller software executable on a controller computer. For example, the method may include receiving input from a user that may be representative of a probe selected to measure the property of a conductive layer. Input from the user may also include a selected program which may include instructions for measuring a property of a conductive layer. The instructions may include an identity of a probe, which may be used for measuring the property of the conductive layer. Therefore, disposing the probe above the conductive layer may include altering a position of the mounting device with controller software executable on a controller computer such that the selected probe may be disposed above the conductive layer.

As shown in step 140, the method may also include contacting a conductive layer with a probe. For example, contacting a conductive layer with a probe may include contacting a conductive layer with a contact surface of each pin of a probe. Alternatively, contacting a conductive layer with a probe may include contacting a conductive layer with a contact surface of one pin of a probe. In addition, contacting a conductive layer with a probe may include moving the mounting device linearly to alter a distance between one of the probes and the conductive layer. For example, the method may include moving the mounting device with a motorized device. As such, the method may include contacting an upper surface of a conductive layer with a probe positioned above the upper surface of the conductive layer. Alternatively, the method may include disposing a plurality of probes above a conductive layer. In this manner, contacting a conductive layer with a probe may include altering a position of one of the plurality of probes such that one of the probes may be in contact with the conductive layer. For example, a position of one of the plurality of probes may be altered with a solenoid coupled to the probe. Additionally, the method may include moving a semiconductor substrate with a stage to alter a distance between at least one of the probes and a conductive layer formed on the semiconductor substrate. The semiconductor substrate may be configured as described in embodiments above.

In addition, the method may include measuring a property of a conductive layer with a probe while the probe is in contact with the conductive layer as shown in step 142. For example, measuring the property of the conductive layer may include measuring a property of a conductive layer within less than approximately 3 mm from an outer edge of a semiconductor substrate. In addition, measuring the property of the conductive layer may include measuring a property of a conductive layer within approximately 1 mm from an outer edge of a semiconductor substrate. The measured property may include a sheet resistance of the conductive layer. The method may further include determining a characteristic of the conductive layer using the measured property. For example, characteristics of a conductive layer such as an implanted region may include implant dose and implantation depth profile. The measured property may also be used to determine a thickness of a conductive layer such as a metallization layer.

In an additional embodiment, the method may include calibrating electronics of the system with at least one resistor pack. The resistor pack may also be coupled to the mounting device as described in above embodiments. The mounting device may also include a plurality of probes and a plurality of resistor packs. In this manner, the method may also include calibrating electronics of the system with one of the plurality of resistor packs. Alternatively, the method may include calibrating at least one of the probes with a probe simulator. In an embodiment, the method may also include supporting a semiconductor substrate with a stage. In addition, the method may include moving a semiconductor substrate with respect to the mounting device with a stage as described in above embodiments. The method may further include transferring a semiconductor substrate into the system from a SMIF or a FOUP to a stage.

In an embodiment, the method may include moving a conditioning plate against a surface of at least one probe to remove contaminants from the surface. In addition, the method may include qualifying at least one probe subsequent to conditioning. The method may also include controlling conditioning and qualifying of at least one probe with controller software executable on a controller computer. The method may further include optimizing a current applied to a probe prior to measuring a property of a conductive layer with the probe. For example, optimizing a current applied to a probe may include applying at least two substantially different currents to the probe. In addition, optimizing a current applied to a probe may include measuring a voltage drop of the probe subsequent to applying each current. The method may further include determining a minimum standard deviation of the measured voltage drop and an applied current associated with the determined minimum standard deviation. The applied current associated with the determined standard deviation may be applied to the probe during measurement.

FIG. 19 illustrates an embodiment of a computer-implemented method for controlling a system configured to measure a property of a conductive layer. The system may be further configured as described in above embodiments. The system may also be coupled to a controller computer. The controller computer may be configured as described in any of the above embodiments. Controller software executable on the controller computer may be operable to implement a method for controlling the system. As shown in step 144, the method may include controlling the system to dispose a probe above a conductive layer. The probe may be coupled to a mounting device that may include at least two probes. The probe and the mounting device may also be further configured as described in above embodiments. As shown in step 146, the method may also include controlling the system to contact the conductive layer with the disposed probe. In addition, the method may include measuring a property of a conductive layer with the probe in contact with the conductive layer as shown in step 148. The measured property may include a sheet resistance of the conductive layer. The method may further include determining a characteristic of the conductive layer using the measured property. For example, characteristics of a conductive layer such as an implanted region may include implant dose and implantation depth profile. The measured property may also be used to determine characteristics of a thickness of a conductive layer.

In an embodiment, the computer-implemented method may include controlling a conditioning plate to remove contaminants from a surface of at least one probe. For example, the method may include controlling a conditioning plate to move against a surface of at least one probe to remove contaminants from the surface. In addition, the method may include qualifying at least one probe subsequent to conditioning with controller software executable on a controller computer. Furthermore, the method may include controlling the system to optimize a current applied to a probe prior to measuring a property of a conductive layer with the probe. For example, controlling the system may include applying at least two substantially different currents to at least one probe. Controlling the system may also include measuring a voltage drop of the probe subsequent to applying each current. In addition, controlling the system may include determining a minimum standard deviation of the measured voltage drop and an applied current associated with the determined minimum standard deviation. In an embodiment, the method may include controlling the mounting device with controller software executable on a controller computer as described in above embodiments.

Figure 20:
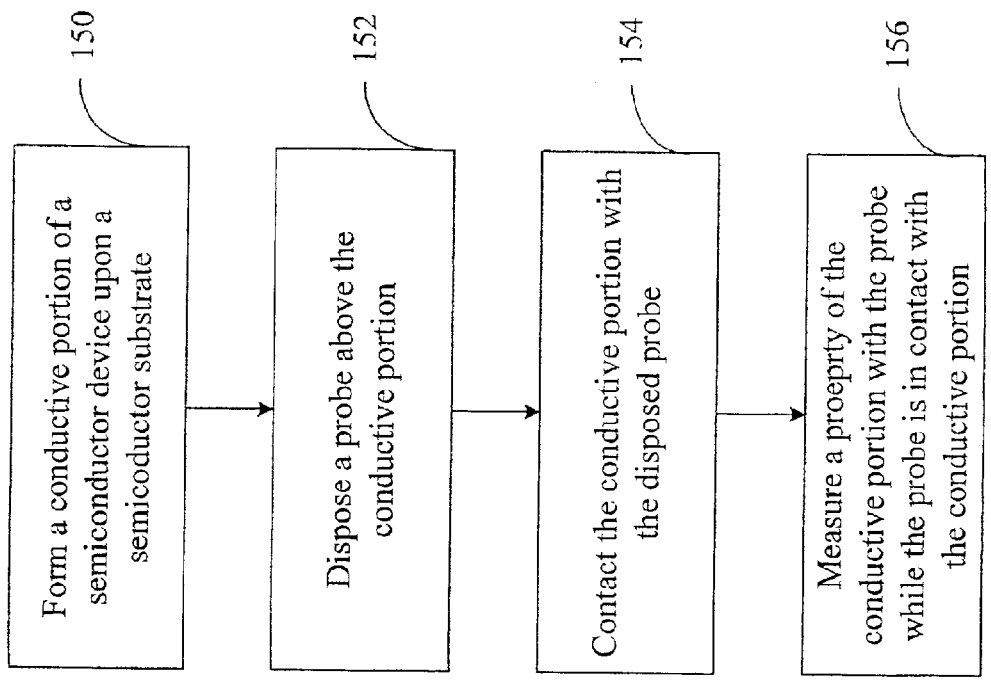
FIG. 20 depicts a flow chart illustrating a method for fabricating a semiconductor device.

FIG. 20 illustrates an embodiment of a method for fabricating a semiconductor device. As shown in step 150, the method may include forming a conductive portion of the semiconductor device upon a semiconductor substrate. For example, the conductive portion may include an implanted region of a semiconductor substrate such as a lightly doped drain junction, a source/drain junction, and an ultra shallow junction. The conductive portion may also include a conductive structure formed upon a semiconductor substrate such as a gate electrode and a local interconnect. For example, the conductive portion may include an implanted region of the semiconductor device such as an ultra shallow junction. In addition, the conductive portion may include a conductive layer such as a metallization layer. As shown in step 152, the method may also include disposing a probe above the conductive portion. The probe may be configured as described in above embodiments. For example, the probe may be coupled to a mounting device. In addition, the mounting device may be configured as described in above embodiments. For example, the mounting device may include at least two probes. As shown in step 154, the method may further include contacting the conductive portion with the disposed probe. Furthermore, the method may include measuring the property of the conductive portion with the probe while the probe is in contact with the conductive portion of the semiconductor device as shown in step 156.

It will be appreciated to those skilled in the art having the benefit of this disclosure that this invention is believed to provide systems and methods for measuring a property of a conductive layer. Further modifications and alternative embodiments of various aspects of the invention will be apparent to those skilled in the art in view of this description. For example, the systems and methods may also be used to measure a property of a conductive layer such as a silicide and an epitaxial layer of silicon. It is intended that the following claims be interpreted to embrace all such modifications and changes and, accordingly, the specification and drawings are to be regarded in an illustrative rather than a restrictive sense.

What is claimed is:

1. A system, comprising:
   at least two probes, wherein each probe is configured to measure a property of a conductive layer during use; and
   a mounting device, wherein at least the two probes are coupled to the mounting device, and wherein the mounting device is configured such that only one of at least the two probes is in contact with the conductive layer during measurement.

2. The system of claim 1, wherein the conductive layer comprises an ultra shallow junction.

3. The system of claim 1, further comprising at least one resistor pack coupled to the mounting device, wherein at least the one resistor pack is configured to calibrate electronics of the system during use.

4. The system of claim 1, wherein each probe comprises four pins, wherein each of the four pins comprises a contact surface configured to contact the conductive layer during measurement, and wherein the contact surface is substantially planar.

5. The system of claim 1, wherein each probe comprises four pins, wherein each pin comprises a contact surface, wherein a first portion of each pin extending from the contact surface comprises a cross-sectional area, wherein the cross-sectional area is substantially parallel to the contact surface, and wherein the cross-sectional area is substantially equal to a surface area of the contact surface across a length of the first portion.

6. The system of claim 1, wherein each probe comprises a pin, wherein the pin comprises a first end having a contact surface configured to contact the conductive layer during measurement, and wherein a first portion of the pin extending from the first end comprises four conductors spaced apart by less than approximately 0.2 mm.

7. The system of claim 1, wherein the mounting device comprises a nonlinear external surface, wherein each probe is coupled to the mounting device such that a portion of each probe extends from the nonlinear external surface, and wherein the mounting device is further configured to rotate such that a contact surface of one of at least the two probes is spaced above and substantially parallel to an upper surface of the conductive layer.

8. The system of claim 1, wherein the mounting device further comprises a solenoid coupled to each of at least the two probes, and wherein the solenoid is configured to alter a position of one of at least the two probes such that the one probe is in contact with the conductive layer during measurement.

9. The system of claim 1, wherein the mounting device is further configured to move rotatably around an axis during use, and wherein the axis is substantially parallel to an upper surface of the conductive layer.

10. The system of claim 1, wherein the mounting device is further configured to move rotatably around an axis during use, and wherein the axis is substantially perpendicular to an upper surface of the conductive layer.

11. The system of claim 1, wherein the system is further configured to measure the property of the conductive layer within approximately 3 mm from an outer edge of a semiconductor substrate.

12. The system of claim 1, further comprising a probe simulator configured to calibrate one of at least the two probes during use.

13. The system of claim 1, further comprising a conditioning plate configured to move against a surface of at least the two probes during use such that contaminants are removed from the surface.

14. The system of claim 13, further comprising:
    a controller computer coupled to the conditioning plate; and
    controller software executable on the controller computer, wherein the controller software is operable to implement a method for controlling the conditioning plate during use.

15. The system of claim 14, wherein the controller software is further operable to implement a method for qualifying at least the two probes subsequent to conditioning.

16. The system of claim 14, wherein the controller software is further operable to implement a method for:
    applying at least two substantially different currents to one of at least the two probes;
    measuring a voltage drop of the one probe subsequent to applying each current; and
    determining a minimum standard deviation of the measured voltage drop and an applied current associated with the determined minimum standard deviation.

17. The system of claim 1, further comprising:
    a controller computer coupled to the mounting device; and
    controller software executable on the controller computer, wherein the controller software is operable to implement a method for controlling the mounting device during use.

18. The system of claim 17, wherein the controller software is further operable to implement a method for determining an identity and a position of at least the two probes within the mounting device.

19. The system of claim 17, wherein the controller software is further operable to implement a method for determining an identity of a probe selected to measure the property of the conductive layer and a position of the selected probe within the mounting device, and wherein the controller software is further operable to implement a method for altering a position of the mounting device such that the selected probe is in contact with the conductive layer during measurement.

20. A method for measuring a property of a conductive layer, comprising:
    disposing a probe above the conductive layer, wherein the probe is coupled to a mounting device, and wherein the mounting device comprises at least two probes;
    contacting the conductive layer with only the disposed probe and not with other probes of the mounting device; and
    measuring the property of the conductive layer with the probe during said contacting.

21. The method of claim 20, wherein the conductive layer comprises an ultra shallow junction.

22. The method of claim 20, further comprising calibrating electronics of the system with at least one resistor pack, wherein at least the one resistor pack is coupled to the mounting device.

* * * * *

UNITED STATES PATENT AND TRADEMARK OFFICE
CERTIFICATE OF CORRECTION

PATENT NO. : 6,815,959 B2
DATED : November 9, 2004
INVENTOR(S) : Johnson et al.

It is certified that error appears in the above-identified patent and that said Letters Patent is hereby corrected as shown below:

Title page,
Item [74], *Attorney, Agent, or Firm*, please delete "Ann Marie Mewherler" and substitute therefor -- Ann Marie Mewherter --.

Signed and Sealed this

Tenth Day of May, 2005

JON W. DUDAS
*Director of the United States Patent and Trademark Office*